(12) United States Patent
Honda et al.

(10) Patent No.: US 7,968,383 B2
(45) Date of Patent: Jun. 28, 2011

(54) ELECTRONIC DEVICE AND METHOD OF MANUFACTURING THE SAME

(75) Inventors: Makoto Honda, Tokyo (JP); Katsura Hirai, Tokyo (JP)

(73) Assignee: Konica Minolta Holdings, Inc., Okyo (JP)

( * ) Notice: Subject to any disclaimer, the term of this patent is extended or adjusted under 35 U.S.C. 154(b) by 32 days.

(21) Appl. No.: 12/335,881

(22) Filed: Dec. 16, 2008

(65) Prior Publication Data

US 2009/0159880 A1 Jun. 25, 2009

(30) Foreign Application Priority Data

Dec. 20, 2007 (JP) ................... 2007-328440

(51) Int. Cl.
*H01L 21/00* (2006.01)
*H01L 21/84* (2006.01)

(52) U.S. Cl. .... 438/149; 438/142; 438/151; 257/E21.32

(58) Field of Classification Search .................. 438/104, 438/142, 149, 158, 197, 151; 257/E21.632
See application file for complete search history.

(56) References Cited

U.S. PATENT DOCUMENTS

| 2008/0081178 A1* | 4/2008 | Hinotsu et al. ............... 428/328 |
| 2009/0025609 A1* | 1/2009 | Egami et al. ............. 106/287.12 |

* cited by examiner

*Primary Examiner* — Hoai v Pham
(74) *Attorney, Agent, or Firm* — Lucas & Mercanti, LLP

(57) ABSTRACT

A method of manufacturing an electronic device comprising the subsequent steps of: providing a thermal conversion material or an area comprising the thermal conversion material and, in an adjoining area or in a vicinity of the thermal conversion material or the area comprising the thermal conversion material, a material having an electromagnetic wave absorbing function or an area comprising the material having the electromagnetic wave absorbing function, in at least a portion on a substrate; and irradiating the substrate with an electromagnetic wave to transform the thermal conversion material into a functional material using a heat generated by the material having the electromagnetic wave absorbing function.

22 Claims, 10 Drawing Sheets

FIG. 1 (1)
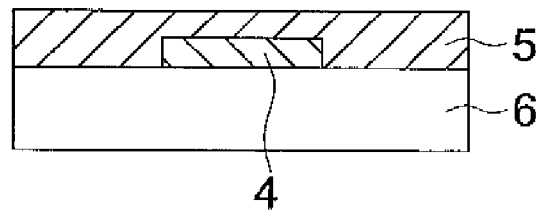
FIG. 1 (2)
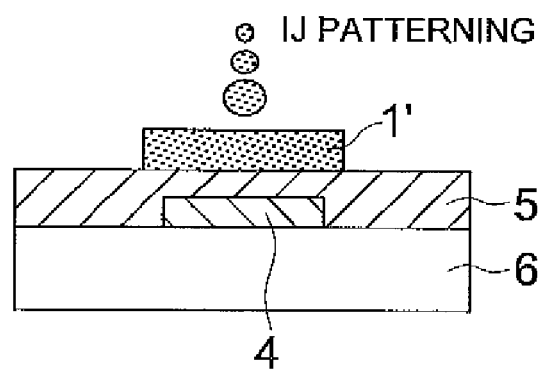
FIG. 1 (3)
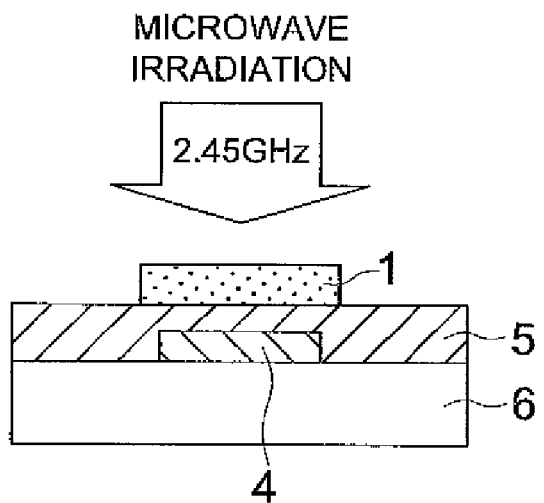
FIG. 1 (4)
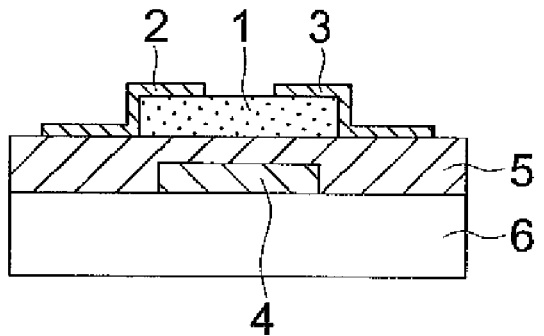

FIG. 2 (1)
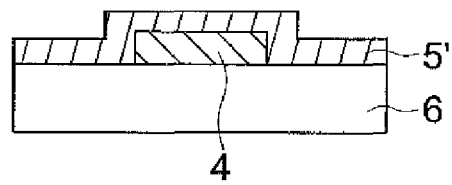
FIG. 2 (2)
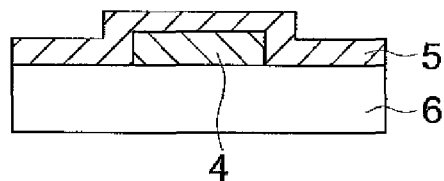
FIG. 2 (3)
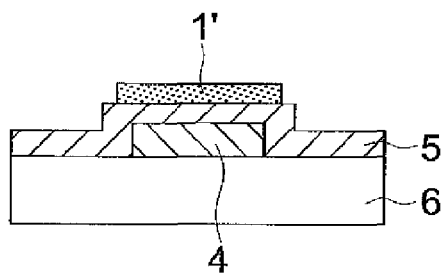
FIG. 2 (4)
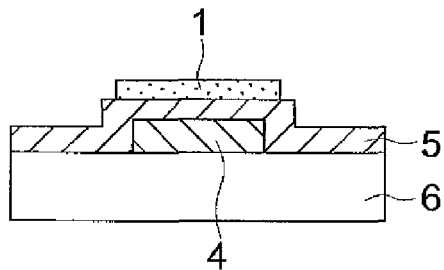
FIG. 2 (5)
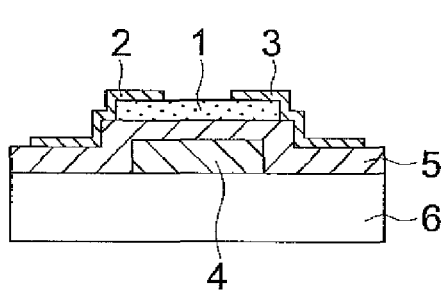

FIG. 3 (1)
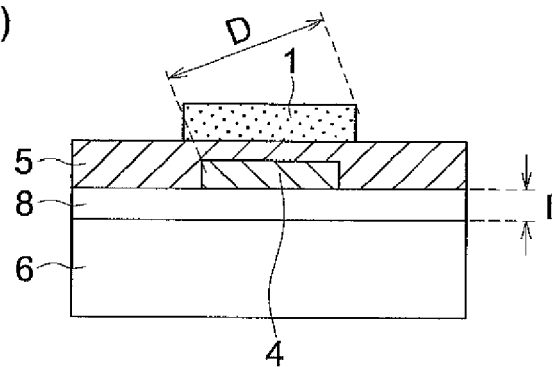
FIG. 3 (2)
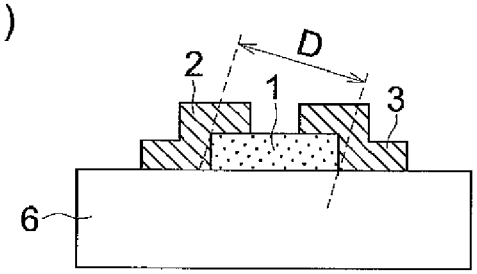
FIG. 4 (a)
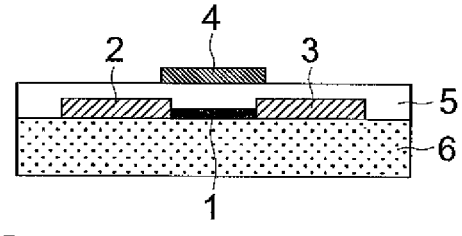
FIG. 4 (d)
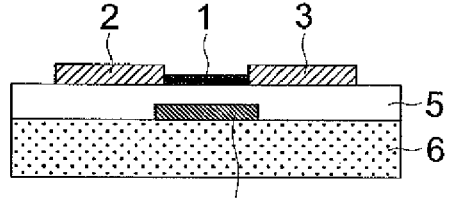
FIG. 4 (b)
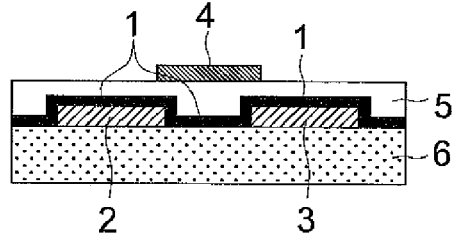
FIG. 4 (e)
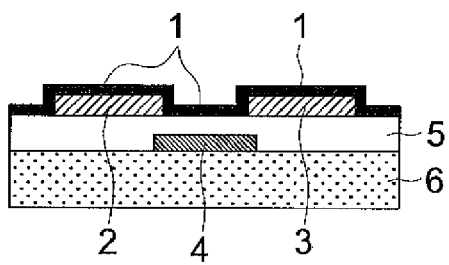
FIG. 4 (c)
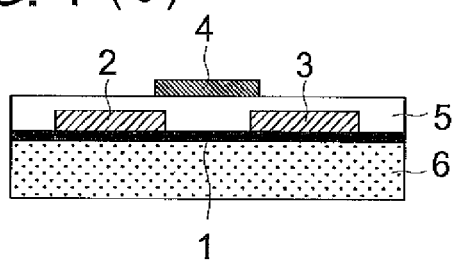
FIG. 4 (f)
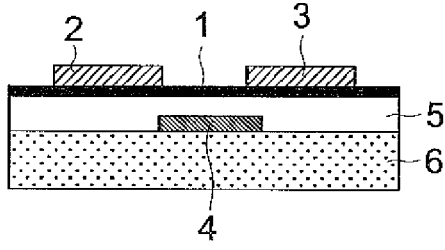

FIG. 6 (1)
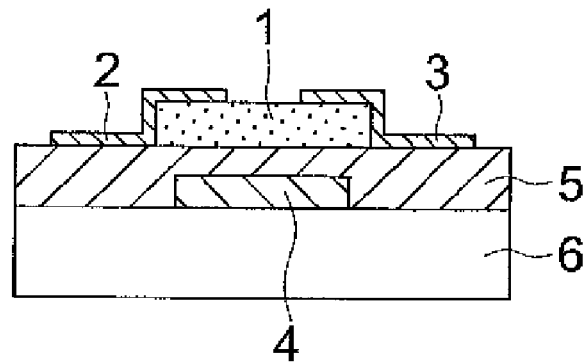
FIG. 6 (2)
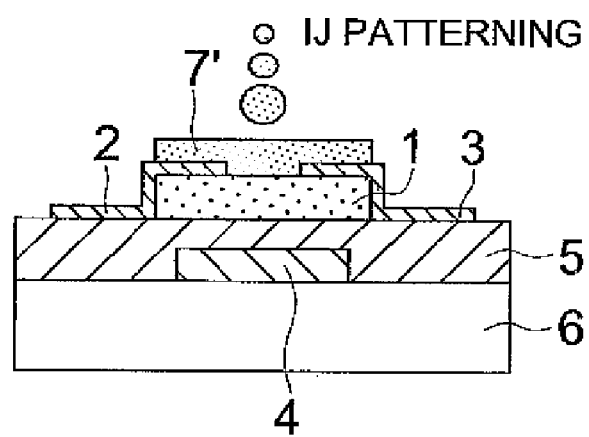
FIG. 6 (3)
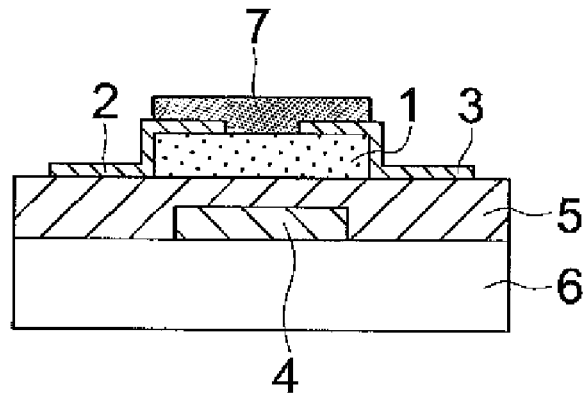

FIG. 7 (1)
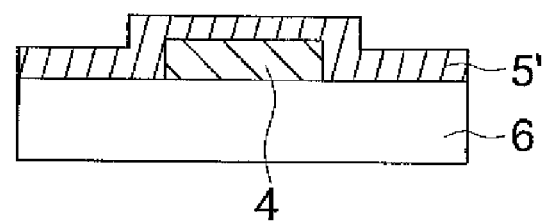
FIG. 7 (2)
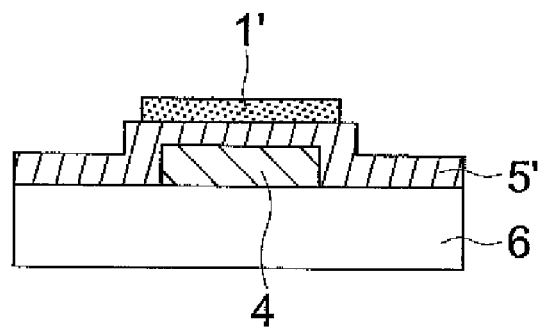
FIG. 7 (3)
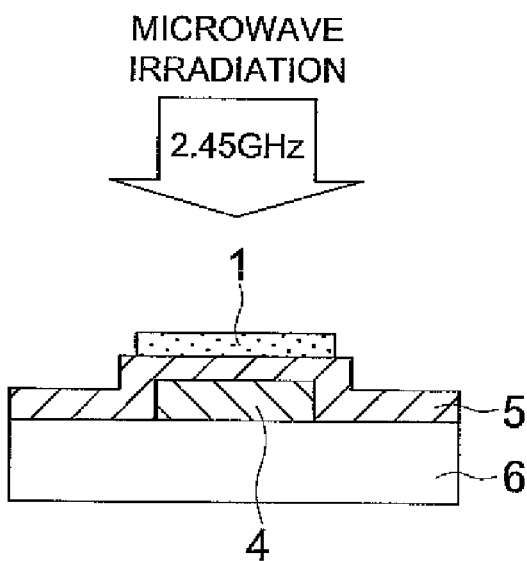
FIG. 7 (4)
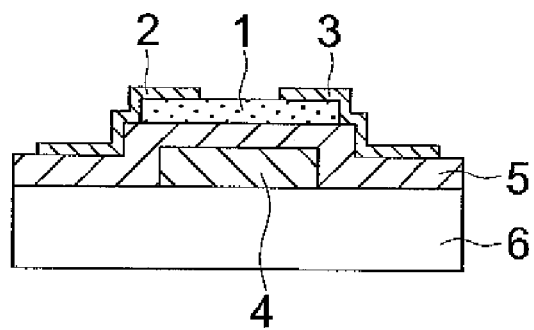

FIG. 8 (1)
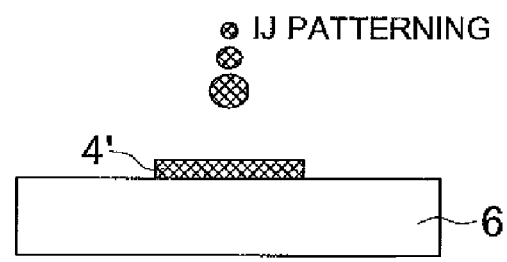
FIG. 8 (2)
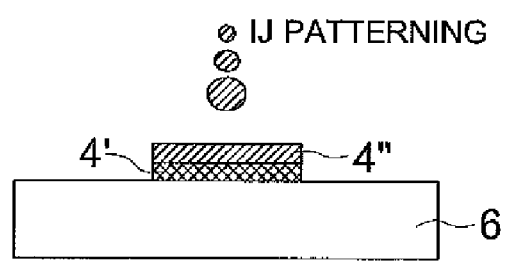
FIG. 8 (3)
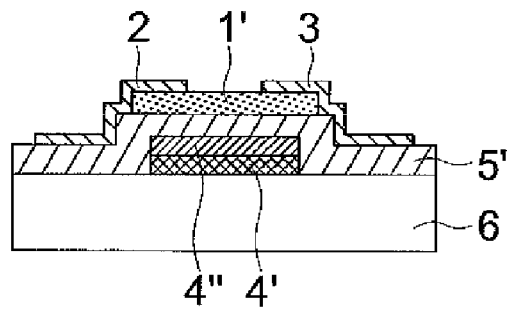
FIG. 8 (4)
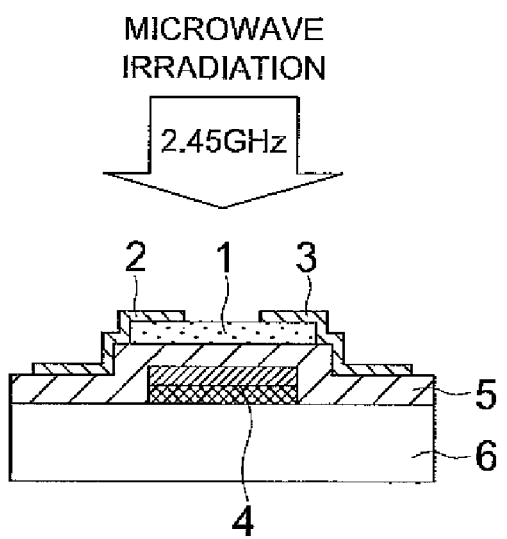

FIG. 9 (1)
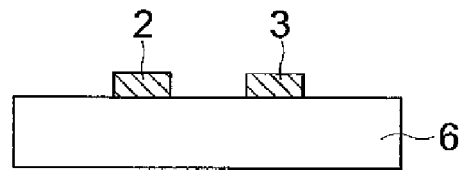
FIG. 9 (2)
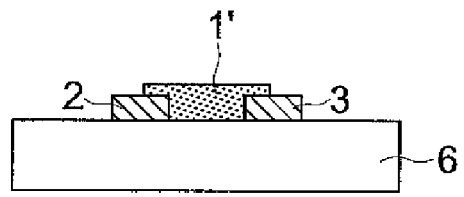
FIG. 9 (3)
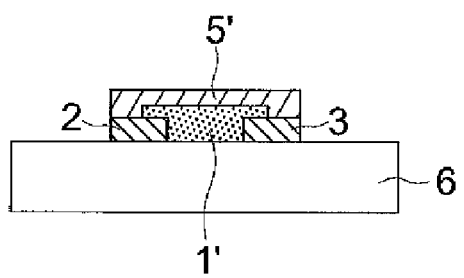
FIG. 9 (4)
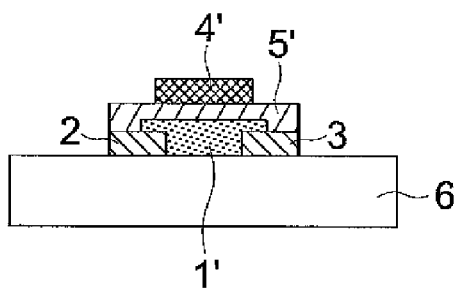
FIG. 9 (5)
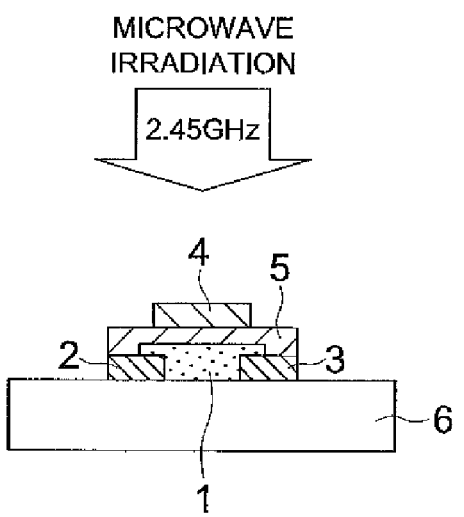

FIG. 10 (1)
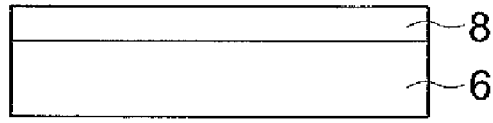
FIG. 10 (2)
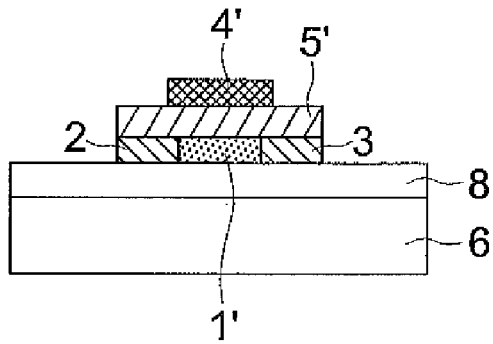
FIG. 10 (3)
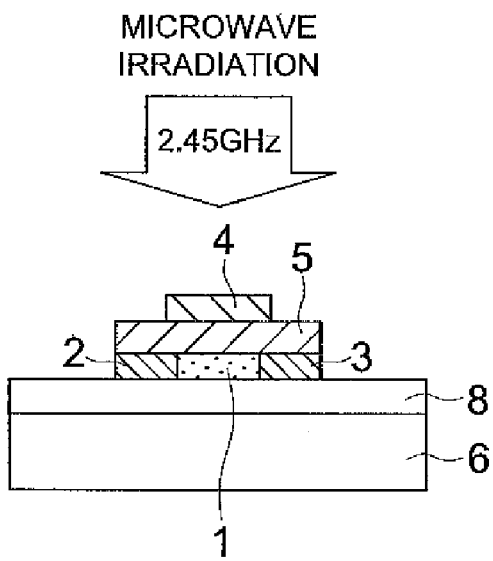
FIG. 10 (4)
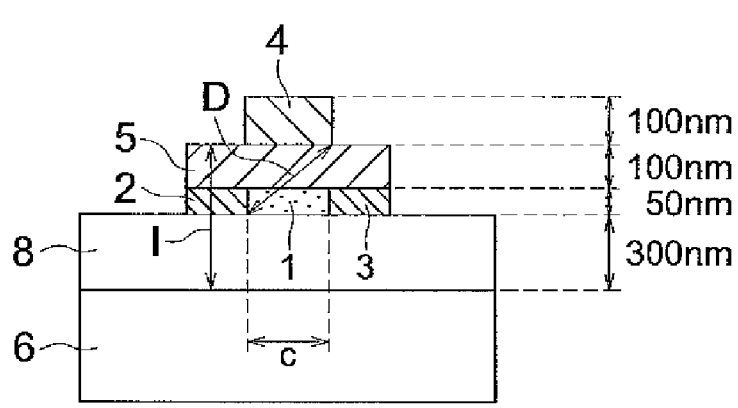

FIG. 11 (1)
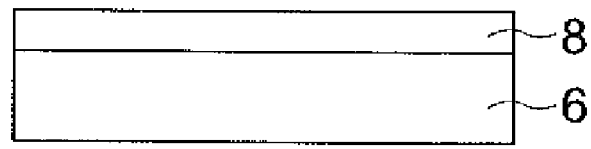
FIG. 11 (2)
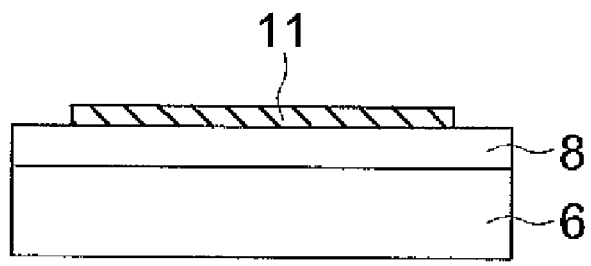
FIG. 11 (3)
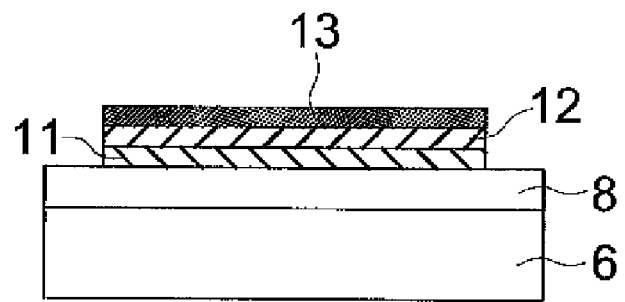
FIG. 11 (4)
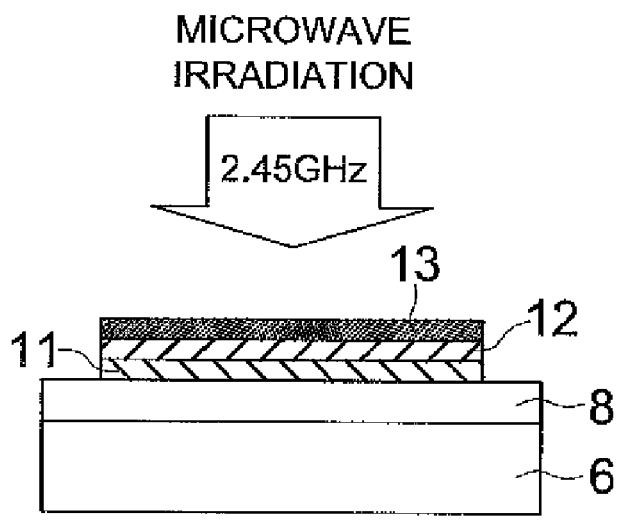

US 7,968,383 B2

ELECTRONIC DEVICE AND METHOD OF MANUFACTURING THE SAME

FIELD OF THE INVENTION

The present invention relates to a method of manufacturing an electronic device with a high efficiency, by which a plurality of functional films, for example, an electrode, an insulating layer and a semiconductor layer are simultaneously formed using a substance having an electromagnetic wave absorbing function and, in more detail, relates to a method of manufacturing an electronic device with a high production efficiency, by which manufacturing via a coating process (for example, printing and IJ) and one process manufacturing of simultaneously forming an electrode and a semiconductor are capable.

BACKGROUND OF THE INVENTION

As a technology to oxidize a metal film to transform the metal film into a metal oxide semiconductor film, an attempt to oxidize a metal film such as Cu, Zn, Al formed on a substrate through thermal oxidation or plasma oxidation to transform the metal film into a metal oxide semiconductor film has been conducted (for example, refer to Patent Document 1). For example, description of In as a dopant is found.

A method to obtain an amorphous oxide via decomposition oxidation (heat decomposition reaction) of an organic metal has also been known (for example, refer to Patent Document 2).

Also, synthesis of an oxide semiconductor thin film through a sol-gel method has been known (for example, refer to Non-Patent Document 1).

In these methods, thermal oxidation or plasma oxidation is used for the oxidation of a precursor. However, in the usual thermal oxidation method, since the treatment is carried out in a very high temperature range of 400° C. or more, the energy efficiency is not high, a relatively long processing time is needed, and the application of a light and flexible resin substrate becomes difficult because the temperature of the substrate increases as high as the treatment temperature.

In the case of plasma oxidation, since the treatment is carried out in an extremely reactive plasma space, there has been a problem that the electrode or the insulating layer is more degraded in the thin film transistor manufacturing process whereby the mobility and the off electric current (dark current) turns worse.

When a transistor is fabricated, at least a patterning of an electrode is needed on the substrate having thereon an electrode. Accordingly, it has been necessary to further form a semiconductor layer.

It has been also the same when a gate insulating layer is formed on a gate electrode. A prescribed solution for forming a gate insulating layer is applied on a substrate on which a gate electrode has already been formed, followed by drying at a temperature of 200° C. or less (refer to Patent Document 3). Accordingly, a high production efficiency is difficult to obtain because the electrode forming process and the insulating layer forming process is separated. Further, the drying of the insulating layer takes time because it is dried by external heating.

In Patent Document 4, an example of fabrication in a vacuum system is disclosed, where the production size is limited by the vessel size. Further, a high production efficiency is difficult to obtain because the electrode forming process and the insulating layer forming process is separated. In Patent Document 5, a production process of an insulating layer via an atmospheric pressure plasma CVD method is disclosed, where, also, a high production efficiency is difficult to obtain because the electrode forming process and the insulating layer forming process is obviously separated.

Further, a method of using other substance as a heat source for calcination such as using infrared light absorption of diamond like carbon (DLC) is disclosed, for example, in Non-Patent Document 2 or 3. This method is used for annealing of a-Si for semiconductors, and formation of poly-Si, in which a DCL layer is formed in the portion adjoining to Si by a vacuum sputtering technique, and annealing and crystallization of Si are carried out by irradiating infrared laser to the DLC layer. However, this method has problems in that the productivity and the material efficiency are not high because the DLC layer is formed under vacuum and the DLC layer which is fundamentally unnecessary must be removed.

Patent Documents 1: Japanese Patent Application Publication Open to Public Inspection (hereafter referred to as JP-A) No. 2003-179242

Patent Documents 2: JP-A No. 2005-223231
Patent Documents 3: JP-A No. 2004-304115
Patent Documents 4: US 2004/0124416 description
Patent Documents 5: JP-A No. 2000-185362
Non-Patent Document 1: Chemical-industry December 2006, pp 7-12.
Non-Patent Document 2: Proceeding of 4th meeting on thin-film forming material device seminar, IIa-1, pp 72-75
Non-Patent Document 3: Proceeding of 4th meeting of Thin-film forming material device seminar, P-8, pp 134-136

SUMMARY OF THE INVENTION

An object of the present invention is to improve the production efficiency and the property of an electronic device, specifically, a thin film transistor, and more concretely, to improve the carrier mobility and the on/off ratio thereof.

One of the aspects of the present invention to achieve the above object is a method of manufacturing an electronic device comprising the subsequent steps of: providing a thermal conversion material or an area comprising the thermal conversion material and, in an adjoining area or in a vicinity of the thermal conversion material or the area comprising the thermal conversion material, a material having an electromagnetic wave absorbing function or an area comprising the material having the electromagnetic wave absorbing function, in at least a portion on a substrate; and irradiating the substrate with an electromagnetic wave to transform the thermal conversion material into a functional material using a heat generated by the material having the electromagnetic wave absorbing function.

BRIEF DESCRIPTION OF THE DRAWINGS

FIGS. 1(1)-1(4) are schematic cross-sectional views illustrating a first aspect of the present invention, in which a thermal conversion material on an electrode pattern (area) is transformed into a semiconductor material by employing the electrode pattern (area) as a heat source by irradiating electromagnetic waves.

FIGS. 2(1)-2(5) are schematic cross-sectional views illustrating a second aspect of the present invention, in which a thermal conversion material on an electrode pattern (area) is transformed into a semiconductor material by employing the electrode pattern (area) as a heat source by irradiating electromagnetic waves.

FIGS. 3(1) and 3(2) are drawings showing relationships with respect to the distance between the heat source area and the substrate and the distance between the heat source area and the function layer precursor area which is transformed by heat.

FIGS. 4(a)-4(f) are drawings illustrating typical configurations of film transistor elements.

FIGS. 6(1)-6(3) are drawings illustrating the manufacturing process of Example 5 as schematic cross-sectional views.

FIGS. 7(1)-7(4) are drawings illustrating the manufacturing process of Example 6 as schematic cross-sectional views.

FIGS. 8(1)-8(4) are drawings illustrating the manufacturing process of Example 7 as schematic cross-sectional views.

FIGS. 9(1)-9(5) are drawings illustrating the manufacturing process of Example 8 as schematic cross-sectional views.

FIGS. 10(1)-10(4) are drawings illustrating the manufacturing process of Example 9 as schematic cross-sectional views.

FIGS. 11(1)-11(4) are drawings illustrating an example to use the method of the present invention for the organic electroluminescent element of the present invention.

DESCRIPTION OF THE PREFERRED EMBODIMENTS

Figure 5:
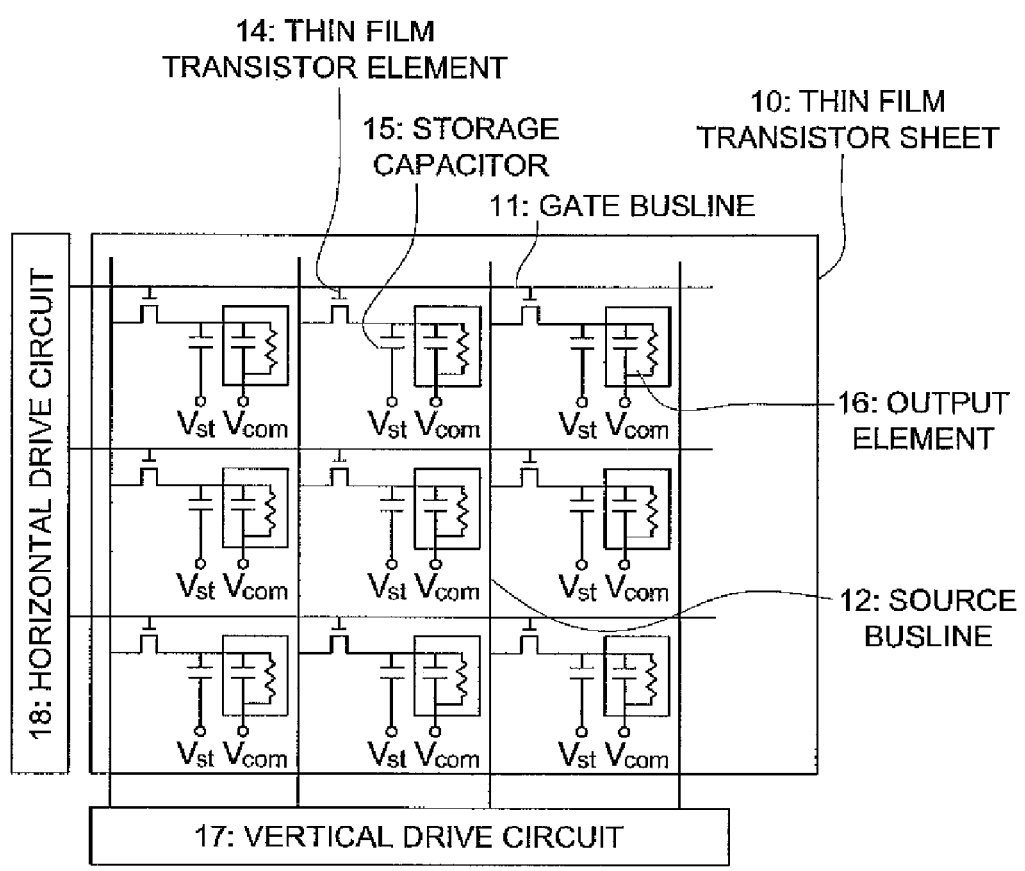
FIG. 5 is a schematic equivalent circuit of an example of a thin film transistor sheet 10 which is a electronic device in which a plurality of thin film transistor elements are arrayed.

The above object of the present invention is achieved by the following structures.
1. A method of manufacturing an electronic device comprising the sequential steps of:
   providing a thermal conversion material or an area comprising the thermal conversion material and, in an adjoining area or in a vicinity of the thermal conversion material or the area comprising the thermal conversion material, a material having an electromagnetic wave absorbing function or an area comprising the material having the electromagnetic wave absorbing function, in at least a portion on a substrate; and
   irradiating the substrate with an electromagnetic wave to transform the thermal conversion material into a functional material using a heat generated by the material having the electromagnetic wave absorbing function.
2. The method of Item 1, wherein the electromagnetic wave is a microwave (frequency of 0.3 GHz-50 GHz).
3. The method of Item 1 or 2, wherein the material having the electromagnetic wave absorbing function is a metal oxide.
4. The method of any one of Items 1 to 3, wherein the material having the electromagnetic wave absorbing function is an electric conductor.
5. The method of Item 3 or 4, wherein the metal oxide comprises a metal oxide of at least one selected from the group consisting of In, Sn and Zn.
6. The method of any one of Items 1 to 5, wherein, as the thermal conversion material or the area comprising the thermal conversion material, at least one of an electrode precursor material, a semiconductor precursor material, an insulator precursor material and a protective film precursor material is formed by coating on the substrate.
7. The method of any one of Items 1 to 6, wherein the electronic devise is a transistor element.
8. The method of any one of Items 1 to 7, wherein the thermal conversion material is a semiconductor precursor material.
9. The method of any one of Items 1 to 7, wherein the thermal conversion material is an insulating film precursor material.
10. The method of any one of Items 1 to 7, wherein the thermal conversion material is a protective film precursor material.
11. The method of any one of Items 1 to 7, wherein the thermal conversion material is an electrode precursor material.
12. The method of Item 11, wherein
    the electrode precursor material comprises a metal; and
    the electrode precursor material adjoins the material having the electromagnetic wave absorbing function or the area comprising the material having the electromagnetic wave absorbing function.
13. The method of Item 3, wherein the semiconductor precursor material is a metal oxide semiconductor precursor which is transformed into a metal oxide semiconductor.
14. The method of Item 13, wherein the metal oxide semiconductor precursor comprises at least one element selected from the group consisting of In, Zn and Sn.
15. The method of Item 13 or 14, wherein the metal oxide semiconductor precursor comprises Ga or Al.
16. The method of Item 8, wherein the semiconductor precursor material is an organic semiconductor precursor which is transformed into an organic semiconductor.
17. The method of any one of Items 1 to 16, wherein
    the material having an electromagnetic wave absorbing function or the area comprising the material having the electromagnetic wave absorbing function comprises an electrode comprising the material having the electromagnetic wave absorbing function;
    the thermal conversion material or the area comprising the thermal conversion material comprises at least two areas selected from the group consisting of an insulator film precursor area, a semiconductor precursor area and a protective film precursor area; and
    after functional layer precursor areas comprising the at least two functional layer precursor areas selected from the group consisting of the insulator film precursor area, the semiconductor precursor area and the protective film precursor area are formed, the substrate is irradiated with the electromagnetic wave to heat the functional layer precursor areas.
18. The method of any one of Items 1 to 16, wherein
    after the material having the electromagnetic wave absorbing function or the area comprising the material having the electromagnetic wave absorbing function, and at least one selected from the group consisting of the insulator film precursor area, the semiconductor precursor area and the protective film precursor area are formed as the area comprising the thermal conversion material, the substrate is irradiated with the electromagnetic wave to heat the area comprising the thermal conversion material.
19. The method of any one of Items 7 to 18, wherein
    the transistor element has a bottom gate structure; and
    a gate electrode is constitute of the material having the electromagnetic wave absorbing function or the area comprising the material having the electromagnetic wave absorbing function.
20. The method of any one of Items 7 to 18, wherein
    the transistor element has a bottom contact structure; and
    a gate electrode is constitute of the material having the electromagnetic wave absorbing function or the area comprising the material having the electromagnetic wave absorbing function.

21. The method of any one of Items 7 to 18, wherein
the transistor element has a top gate structure; and
a gate electrode is constitute of the material having the electromagnetic wave absorbing function or the area comprising the material having the electromagnetic wave absorbing function.
22. The method of any one of Items 1 to 21, wherein
at least one selected from the group consisting of the electrode precursor material, the semiconductor precursor material, an insulator precursor material and the protective film precursor material is formed by a coating method on the substrate as the thermal conversion material or the area comprising the thermal conversion material.
23. The method of any one of Items 1 to 22, wherein a temperature at which the thermal conversion material is heated by a heat generated by the material having the electromagnetic wave absorbing function is 100 to 300° C.
24. The method of any one of items 1 to 23, wherein the substrate is a resin substrate.
25. The method of any one of Items 1 to 24, wherein
the minimum distance between the substrate of the electronic device and the material having an electromagnetic wave absorbing function or the area containing a material having an electromagnetic wave absorbing function (heat-source area) is preferably in the range of 1/200-1.0 times of the longest distance between: the functional layer precursor area side boundary of the heat-source area which generates heat with absorbing an electromagnetic wave; and any boundary of the functional layer precursor area which is to be transformed into a functional layer by heat.
26. The method of any one of Items 1 to 25, wherein the substrate is a resin substrate.
27. The electronic device manufactured by the method of any one of Items 1 to 26.

According to the present invention, by heating simultaneously an electrode and its neighborhood (for example, an adjoining layer) using a metal oxide such as an ITO precursor as an electrode material, the functional material layer which is adjoining to the electrode can be simultaneously heat-treated. According to this method, formation of a functional layer, for example, a semiconductor and an insulating layer can be simultaneously proceeded with electrode formation using a material which can be functionalized by heat such as a semiconductor precursor and an insulator precursor, whereby the production efficiency is improved and also the transistor performance is improved since the electrode/functional layer interface is optimally formed.

The present invention discloses a method of manufacturing an electronic device characterized in that, in at least a portion on a substrate, a thermal conversion material or an area containing a thermal conversion material, and, in the adjoining area or in the vicinity thereof, a material having an electromagnetic wave absorbing function or an area containing a material having an electromagnetic wave absorbing function are arranged, followed by irradiating thereon an electromagnetic wave to transform the thermal conversion material into a functional material using the heat generated by the material having an electromagnetic wave absorbing function.

When a thin film transistor as an electronic device is manufactured, the fundamental structural elements include a gate electrode, a gate insulating layer (film), a thin film semiconductor and source drain electrodes which are fabricated to form a laminated structure. Since it has the laminated structure, a desired transistor performance cannot be obtained unless the interface between each structural element is formed precisely, while each structural element providing an expected function, such as conductivity and insulation. Degradation of the mobility due to deterioration of a semiconductor/gate insulating layer interface or increase in leakage current due to contamination of the gate insulating layer with trace amount of impurity might become a problem.

For example, when the method of the present invention is used for manufacturing a thin film transistor, no special additive nor additional structure for heating the precursor material is needed and a plurality of structural elements can be simultaneously formed, since the structural element having an electromagnetic wave absorbing function itself generates heat when irradiated with electromagnetic waves, whereby the precursor material of each structural element can be effectively transformed into a functional material. Further, each interface between structural elements near the heat generating area can be formed relatively precisely, which can be assumed to be a special effect of local heating employing an electromagnetic wave, whereby a high performance thin film transistor can be manufactured even when the heating temperature is low. When compared with the conventional method in which whole the device, which is an aggregate of the elements containing a substrate, is heated, a higher performance of the electronic device can be obtained because insufficient adhesion tends not to occur between the substrate and the structural element of the electronic device (element) or between the structural elements due to the difference in thermal expansion coefficients, or because deterioration of the performance of each element tends not to occur. A larger effect of the present invention is obtained when a resin substrate having a larger thermal expansion coefficient is employed compared to when the conventional heating method is applied.

Further, in one part of the aspects of the present invention, a coating process or a wet process, using a printing method or an IJ (inkjet) method, can be employed to form each functional layer using a precursor solution, whereby a continuous manufacturing or a roll to roll production using a flexible substrate under an atmospheric pressure becomes possible. Therefore, drastic improvement in the production efficiency can be attained compared to the batch production system using a conventional vacuum apparatus employing a sputtering technique or a CVD technique. When each functional layer is formed via the application process or the wet process, precise formation of an interface between each layer with satisfactory adhesion can be attained, whereby an electronic device exhibiting excellent performance can be obtained. Further, since on demand patterning employing a printing method or an IJ method is usable, laborsaving of a manufacturing process compared to the conventional patterning method using photolithography is possible, whereby the production efficiency can be improved.

Here, the thermal conversion material means a precursor which is transformed into a various kinds of functional material (layer) by heat in an electronic device. Specific examples of a thermal conversion material include a semiconductor precursor material, an insulator precursor material and an electrode precursor material, each of which is a functional material precursor transformed into a semiconductor, an insulating material and an electrode by heat, respectively. A thermal conversion material also includes a material exhibiting so called an annealing effect besides the material that reacts by heat.

In the present invention, the substance having an electromagnetic wave absorbing function means a substance having an ability to increase the temperature of the substance by the heat generated by itself when the substance is irradiated with an electromagnetic wave. Whether the substance generates heat or not can be confirmed by irradiating an electromagnetic wave while contacting a temperature sensor such as a thermocouple to the substance. A substance having an electromagnetic wave absorbing function includes, for example, a metal oxide. Further, the substance having an electromagnetic wave absorbing function is preferably a conductor. When a metal oxide is used as a conductor, the specific resistance of the metal oxide is preferably $1.0 \times 10^{-2}$ Ω·cm or less and more preferably $1.0 \times 10^{-4}$ Ω·cm or less. By using a metal oxide having the specific resistance of the abovementioned range, the function as an electrode and the function as a heating element by electromagnetic wave absorption can be provided with a preferable balance.

It is preferable that the above-mentioned metal oxide includes, at least, an oxide containing In, Sn or Zn, because of their high conductivities. Further, because of their high electromagnetic wave absorbing powers, the metal oxide preferably includes, at least, an oxide containing In or Sn, and, specifically preferable is to include In oxide.

Specifically, when ITO which is a conductor is used for an electrode, the ITO electrode pattern most quickly attains an elevated temperature. After forming a pattern using a material having such an electromagnetic wave absorbing power, by forming, for example, a functional layer precursor (such as a semiconductor precursor) area (thin film) on it followed by irradiating an electromagnetic wave, the temperature of not only the ITO electrode pattern but also the vicinity thereof is elevated, the transformation of the thermal conversion material layer to a functional material layer (such as a semiconductor layer) is proceeded simultaneously with the ITO electrode pattern by the heat of ITO.

Moreover, both an electrode and a functional material layer can be formed simultaneously by forming an area containing an electrode precursor material according to the electrode pattern, forming an area containing thermal conversion material, and by irradiating an electromagnetic wave.

The substance having an electromagnetic wave absorbing function or the area containing the substance having an electromagnetic wave absorbing function is preferably an electrode.

An electronic device employing a substance having an electromagnetic wave absorbing function or an area containing the substance having an electromagnetic wave absorbing function as an electrode is preferably, for example, a thin film transistor element.

An electronic device manufactured as described below is preferably a thin film transistor element: a material having an electromagnetic wave absorbing function or an area containing a material having an electromagnetic wave absorbing function is employed as an electrode; a plurality of functional areas, for example, an insulator film, a semiconductor and a protective film are formed; and a plurality of functional layers are simultaneously formed by simultaneously heating the functional layer precursor areas using the material having an electromagnetic wave absorbing function or the area containing a material having an electromagnetic wave absorbing function as a heat source by irradiating an electromagnetic wave.

For example, after at least two functional layer precursor areas of an electrode employing a substance having an electromagnetic wave absorbing function or an area containing the substance having an electromagnetic wave absorbing function, an insulating layer precursor area, a semiconductor layer precursor area and a protective film precursor area are formed, an electromagnetic wave is irradiated to simultaneously form a plurality of functional layers by simultaneously heating the functional layer precursor areas.

Also, it is possible that, after an electrode is formed employing a substance having an electromagnetic wave absorbing function or an electrode precursor containing the substance having an electromagnetic wave absorbing function, and at least one functional layer precursor area among an insulating layer precursor area, a semiconductor layer precursor area and a protective film precursor area is formed, an electromagnetic wave is irradiated to form both an electrode and a functional layer by heating the electrode precursor area itself and a functional layer precursor area.

Therefore, the present invention discloses a method of manufacturing a thin film element (a thin film device) in which: an area is formed using a substance having an electromagnetic wave absorbing function on a substrate; an area containing a functional material precursor is formed on the abovementioned area; an electromagnetic wave is irradiated on the substrate having thereon the above-mentioned areas to generate heat in the area containing the substance having an electromagnetic wave absorbing function; and the area containing a functional material precursor is heated by the generated heat in the vicinity of the area containing the substance having an electromagnetic wave absorbing function to transform the functional material precursor into a functional material (thin film).

As the thermal conversion material to be transformed into a functional material or its film, the following cases are included: a first aspect of the present invention is the case where the thermal conversion material is a semiconductor precursor material; a second aspect of the present invention is the case where the thermal conversion material is a insulator precursor material; a third aspect of the present invention is the case where the thermal conversion material is a protective film precursor material; and also the case where the thermal conversion material is an electrode precursor material is included.

The above cases will be explained below.

The first aspect of the present invention include the case where a substance having an electromagnetic wave absorbing function or an electrode pattern (area) containing a substance having an electromagnetic wave absorbing function is formed on a substrate; a semiconductor precursor material area is formed on it; an electromagnetic wave is irradiated on them to simultaneously form an electrode and a semiconductor layer.

The above first aspect will be explained using the figures.

FIG. 1(1) shows a cross-sectional view illustrating a step in which, for example, gate electrode 4 made of an ITO thin film is formed on glass substrate 6 and, further, gate insulating layer 5 is formed on it. An electrode pattern is formed by sputtering an ITO thin film on a glass substrate followed by patterning, and, subsequently, an insulating layer made of silicon oxide is formed via, for example, sputtering in the same way as above or a plasma CVD method. Conductive ITO has an electromagnetic wave absorbing function.

Subsequently, on gate insulating layer 5, an acetonitrile solution of $In(NO_3)_3$, $Zn(NO_3)_2$ and $Ga(NO_3)_3$ (mass ratio of 1:1:1) is ejected using an inkjet apparatus to form a thin film containing the metal ions. Then, the thin film is dehydrated and dried to form, for example, a semiconductor precursor material area (metal oxide semiconductor precursor material thin film 1') having an average layer thickness of 100 nm (FIG. 1(2)).

When metal oxide semiconductor precursor material thin film 1' is formed on gate electrode 4, in this way, in its channel region (area) and irradiated with an electromagnetic wave, as the result of the electromagnetic wave (microwave) irradiation, the electrode pattern made of ITO, the electrode pattern having an electromagnetic wave absorbing function, absorbs the electromagnetic wave and generates heat inside the electrode patter, whereby metal oxide semiconductor precursor material thin film 1' is transformed into metal oxide semiconductor layer 1 because the vicinity of the electrode pattern is heated due to thermal conduction (FIG. 1(3)).

When compared with the usual heating method using, for example, an oven, a more preferable metal oxide semiconductor layer can be obtained by using the heating method employing electromagnetic wave (microwave) irradiation of the present invention. In the process of transforming a metal oxide semiconductor precursor material into a metal oxide semiconductor, a function other than the thermal-conduction from the electrode pattern made of ITO having an electromagnetic wave absorbing function, for example, an effect suggesting a direct action of the electromagnetic waves to metal oxide semiconductor precursor material has been obtained. Although the mechanism is not fully clarified, it is assumed that the conversion of the metal oxide semiconductor precursor material to the metal oxide semiconductor by hydrolysis, dehydration, decomposition or oxidation has been promoted of metal oxide semiconductor precursor material, desiccation and decomposition, oxidation, etc. is presumed to be the result promoted by electromagnetic waves.

The transformation of metal oxide semiconductor precursor layer 1' to metal oxide semiconductor layer 1 is preferably carried out in an atmosphere containing oxygen or in air in order to improve the performance of the semiconductor.

(Heating Temperature)

In the present invention, the temperature to heat the precursor material can be arbitrarily selected in the range of 50° C.-1000° C. of the surface temperature of a thin film containing a precursor. The temperature is preferably 50° C.-400° C. in view of the performance of the device and the productivity. The surface temperature of a thin film or the temperature of a substrate can be measured by, for example, a surface thermometer having a thermocouple, a radiation thermometer which can measure a radiation temperature and a fiber thermometer. The heating temperature can be controlled by the output power of the electromagnetic wave, the duration of irradiation and the number of times of irradiation. The heating temperature is further more preferably, 100° C.-300° C., whereby a substrate having a low thermal resistance such as a resin substrate can be employed. The heating duration of the precursor material can be arbitrary selected, however, the heating duration is preferably 1 second to 60 minutes in view of the performance of the device and the productivity. The heating duration is more preferably 5 minutes to 30 minutes.

Subsequently, source electrode 2 and drain electrode 3 are formed by, for example, vacuum evaporation of gold to obtain a thin film transistor element (FIG. 1(4)).

By forming a semiconductor precursor layer using, for example, an organic semiconductor precursor material, bicyclo porphyrin, disclosed in JP-A No. 2003-304014 as a semiconductor layer instead of metal oxide semiconductor material precursor thin film 1', the organic semiconductor precursor material can be transformed into an organic semiconductor layer via the thermal decomposition by the heat generated by the electromagnetic wave absorption of the ITO electrode, whereby an organic thin film transistor can be efficiently manufactured.

While ITO thin film is a substance having an electromagnetic wave absorbing function, an electrode made of a usual metallic material does not absorb an electromagnetic wave. Accordingly, an electrode made of a usual metallic material can be a heat source, by forming a material having an electromagnetic wave absorbing function, such as ITO, on the electrode. Further, it is also possible to form an electrode pattern using an electrode precursor material which will be described later and to transform it into an electrode material with a material having an electromagnetic wave absorbing function such as ITO.

On the contrary, it is also possible to apply an electrode precursor material, for examples nano particles (dispersing element) of the metal disclosed in, for example, JP-A Nos. 3-34211 and 11-80647 on an ITO thin film which is a metal oxide conductor, to calcinate the electrode precursor to obtain an electrode by the heat generated by ITO.

While the above described are the examples in which a semiconductor layer as a functional layer is formed by the heat generated by the electromagnetic wave irradiation on the electrode pattern having an electromagnetic wave absorbing function, it is also possible, for example, as described in the second aspect of the present invention, to use an insulating layer precursor material (which will be described later) as a thermal conversion material, and to transform it to an insulating layer.

This example will be shown in FIG. 2(1)-2(5). FIG. 2(1) illustrates the step in which gate electrode 4 made of ITO is formed on glass substrate 6, and further insulating layer precursor area 5' is formed according to the insulating layer pattern. ITO is formed on the glass substrate, for example, by a sputtering method. By using a mask or by patterning using a photoresist, a pattern of gate electrode 4 is obtained.

For example, when a silicon oxide film is formed, as an insulating layer precursor material, metal compounds such as tetraethoxysilane, disilazane and polysilazane can be used. Thin film insulating layer precursor material area 5' is formed, for example, by applying tetraethoxysilane (TEOS) on the gate electrode pattern made of abovementioned ITO (FIG. 2(1)).

As insulating layer precursor materials, precursors which form metal oxide thin films exhibiting a high dielectric constant, for example, silicon oxide, aluminum oxide, tantalum oxide, titanium oxide, tin oxide and vanadium oxide are cited. Of these, silicon oxide, aluminum oxide, tantalum oxide and titanium oxide are preferable. Metal nitrides, such as silicon nitride and aluminum nitride, can also be used preferably.

As the precursor which forms these materials, for example, preferable is so called a sol-gel film, and a method called a sol-gel method is used. In the sol-gel methods a solution obtained by hydrolyzing and polycondensating an alkoxide or a halide of the metal forming the above metal oxides, such as silicon, in an arbitrary organic solvent or in water using, for example, an acid catalyst is coated and dried. According to this method, wet processes, for example, a method of coating such as a spray coat method, a spin coat method, a blade coat method, a dip coat method, a cast method, a roll coat method, a bar coat method and a die coat method; or a method of patterning such as printing and an inkjet method are applicable according to the material.

When an organic compound thin film is used as an insulating layer precursor material, a thin film of the following material can be obtained by a coating method, in the same way as above, followed by transforming the thin film into an insulator film. Examples of the above material include: a material which is polycondensed with heat to form an insulating organic film; a precursor material which forms an insulating film by polycondensation such as hardenable polyimide; a photo-curable resin due to photo-radical polymerization or photo-cationic polymerization; a copolymer containing a acrylonirile component; and such as polyvinyl phenol, polyvinyl alcohol, and a novolak resin, containing a crosslinking agent. For example, as hardenable polyimide, CT 4112, 4200 and 4150 produced by KYOCERA Chemical Corporation are available.

The thickness of the insulator film is generally 50 nm-3 µm and preferably 100 nm-1 µm.

After insulating layer precursor material area 5' is formed, an electromagnetic wave, preferably, a microwave is irradiated. The gate electrode material having an electromagnetic wave absorbing function (ITO) absorbs the microwave. Since microwave absorption is concentrated on a substance having a high electromagnetic wave absorbing power, as the result, the substance having a high electromagnetic wave absorbing power is heated first from inside generating Joule heat, in the electrode precursor material. The Joule heat is transferred to its vicinity and heat the neighboring insulating layer precursor material area' and the insulating layer precursor material area is transformed into gate insulating layer 5 (FIG. 2(2)).

In the peripheral (vicinity) of the gate electrode having an electromagnetic wave absorbing function, the oxidation insulator film is obtained by forming $SiO_2$ bond, whereby the electrode and the oxidation insulating layer can be simultaneously formed (FIG. 2(3)).

Since oxygen is needed for formation of these insulating layers, thermal oxidation occurs by irradiating a microwave in air, whereby a high performance insulating layer is formed.

The heating temperature is preferably 50° C.-400° C. When a resin substrate is used, the surface temperature of the thin film containing a precursor is preferably controlled in the range of 100° C.-300° C., by controlling the power of the electromagnetic wave, the irradiation duration and the number of times of irradiation, since the heat resistance of the resin is low.

After the insulating layer is formed, formation of the semiconductor layer and formation of the source and drain electrodes are carried out according to a known method, in a similar process as above FIGS. 1(1)-(4) to obtain a thin film transistor element (FIG. 2(3)-2(5)).

Alternatively, after insulating layer precursor material area 5' is formed, a metal oxide semiconductor precursor area may further be formed. After, both the areas are dried, an electromagnetic wave, preferably, a microwave is irradiated, whereby both the areas are transformed into a insulating layer and a semiconductor layer, respectively, by simultaneously heating the metal oxide semiconductor precursor area together with the insulating layer precursor material area using the heat generated with the absorption of the electromagnetic wave by the ITO electrode.

In the present invention, the minimum distance between the substrate of an electronic device and the material having an electromagnetic wave absorbing function or the area containing a material having an electromagnetic wave absorbing function (heat-source area) is preferably in the range of 1/200-1.0 times of the longest distance between: the functional layer precursor area side boundary of the heat-source area which generates heat with absorbing an electromagnetic wave; and any boundary of the functional layer precursor area which is to be transformed into a functional layer by heat.

This feature is explained by FIGS. 3(1) and 3(2).

FIG. 3(1) shows the step in which gate electrode 4 gate insulating layer 5 and, further, functional layer precursor thin film 1', which is transformed into a semiconductor layer, are formed on substrate 6 through intermediate layer 8.

The gate electrode corresponds to the material having an electromagnetic wave absorbing function or the area containing a material having an electromagnetic wave absorbing function (heat-source area). The minimum distance between the heat-source area and the substrate corresponds to thickness I of the intermediate layer provided between the gate electrode and the substrate. The minimum distance corresponds to the thickness just beneath the gate electrode.

The longest distance between; the functional layer precursor area (to be transformed by heat) side boundary of the heat-source area which generates heat with absorbing an electromagnetic wave; and any boundary of the functional layer precursor area which is to be transformed into a functional layer by heat corresponds to the longest distance between the functional layer precursor area (to be transformed by heat) side boundary among the peripheral boundaries of the heat-source area (gate electrode 4 in this figure) and the boundaries of the functional layer precursor area, namely, in the figure, the longest distance between any position in the functional layer precursor area (to be transformed by heat) side boundary and any position in all the boundaries of the functional layer precursor area, and corresponds to D in FIG. 3(1), which is determined by looking over the whole boundaries of each area forming the precursor.

Another example is given in FIG. 3(2) for an understanding of the concept of the longest distance (D) determined between: the functional layer precursor area (to be transformed by heat) side boundary of the heat-source area which generates heat with absorbing an electromagnetic wave; and the boundaries of the functional layer precursor area which is to be transformed into a functional layer by heat.

When the heat-source area which generates heat with absorbing an electromagnetic wave in FIG. 3(2) is source electrode 2 or drain electrode 3, the longest distance determined between: the functional layer precursor area (to be transformed by heat, functional layer precursor thin film 1') side boundary of the heat-source area which generates heat with absorbing an electromagnetic wave; and all the boundaries of the functional layer (semiconductor layer) which is provided in the channel area between source electrode 2 and drain electrode 3, is represented as D in this figure.

When the conversion material area is far from the heat-source material, thermal conversion of the conversion material may not sufficiently proceed.

Namely, when the area containing a material having an electromagnetic wave absorbing function (heat-source area) is a gate electrode, in order to sufficiently transform the thermal conversion material into a functional material by the transfer of the heat generated by the gate electrode with absorbing an electromagnetic wave, without damaging the substrate (specifically a plastic substrate), the minimum distance I between the gate electrode and the substrate (usually the thickness of an undercoat layer formed on the substrate on which the gate electrode is to be formed corresponds to I) is preferably 1/200-1.0 times of D which is the distance between the heat source and such as an insulating layer precursor area or a semiconductor layer precursor area which is to be heat transformed.

For example, even when a thermal conversion material layer is provided between the area containing an electromagnetic wave absorbing function (heat-source area) and the substrate (support), or when the thermal conversion material layer is provided on the side opposite to the substrate, the distance between of the area containing an electromagnetic wave absorbing function (heat-source area) and the substrate or the distance between the area containing an electromagnetic wave absorbing function (heat-source area) and the thermal conversion material layer is measured after the thermal conversion material layer is transformed into a functional layer by heat.

When the distances are in this range, the thermal conversion material is fully transformed into a functional material in the vicinity of the area containing an electromagnetic wave absorbing function as a heat-source, while damage of the substrate is limited. When the ratio is less than 1/200, damage to the substrate might occur or the transformation of the thermal conversion material to a functional material might be insufficient. Alternatively, when the ratio is more than 1.0, the performance of the device becomes also insufficient or a problem such as a crack begins to appear and the advantage of the thin film material such as flexibility might be lost.

Therefore, when the above relationship is satisfied, the method can also be applied for the formation of a protective film when a protective film is formed over a transistor element. For example, as a third aspect of the present invention, a protective film can be formed with electromagnetic wave irradiation using a protective film precursor as a thermal conversion material. For the formation of the protective film, a material similar to the abovementioned insulator film precursor material may be employed.

In the present invention, if it is a material having an electromagnetic wave absorbing function, an electrode precursor material can be used as a material which transforms itself into an electrode material by absorbing an electromagnetic wave to generate Joule heat.

Namely, it is possible to form the electrode itself and an adjoining functional layer, for example, an insulating layer or a semiconductor layer, by the heat generated by the electromagnetic waves absorption of the electrode precursor area.

Similarly to FIGS. 1(1)-1(4), an electrode precursor area can be formed along the pattern of gate electrode 4 with an electrode precursor material having an electromagnetic wave absorbing function, for example, ITO particulates. The "coating" herein refers to not only so called coating but also a wet process including an inkjet method and a printing method using a coating solution or an ink, in a broad sense.

A dispersion of ITO particles in water or in an organic solvent such as alcohol can be used to draw a figure on a substrate via, for example, an inkjet method using the dispersion as a coating.

For example, on an electrode material precursor area formed along an electrode pattern using, for example, ITO particulates similarly to the above, a thin film containing metal ions is formed as a metal oxide semiconductor material precursor, for example, a solution of $In(NO_3)_3$, $Zn(NO_3)_2$, and $Ga(NO_3)_3$ (in a composition ratio of 1:1:1 by mass) each dissolved in water is ejected using an inkjet apparatus to form a film. The thin film containing metal ions is then dried and irradiated with an electromagnetic wave, whereby the electrode material precursor is transformed by calcination and the area of the metal oxide semiconductor material precursor is transformed into a metal oxide semiconductor layer due to the heat transfer from the electrode material precursor area, since the electrode material precursor area is heated from inside due to the heat generated in the inside of the electrode pattern with the electromagnetic wave irradiation.

Since the electrode material or the precursor material having an electromagnetic wave absorbing function generates Joule heat due to the vibration of electrons when irradiated with an electromagnetic wave such as microwave, the electrode material or the precursor material is uniformly heated from inside. On the other hand, almost no absorption in a microwave range is observed for glass or a resin. Accordingly, the substrate is hardly heated with microwave irradiation. Therefore, when a resin substrate is used, an electronic device, such as a thin film transistor element, can be manufactured without causing heat deformation or deterioration by keeping a prescribed distance from the substrate, as described above, when a heating layer is provided.

As is general for an electromagnetic wave heating such as microwave heating, absorption of an electromagnetic wave (a microwave) is concentrated on a material having a strong absorbing power and it is possible to increase the temperature up to 500-600° C. in a short time. Accordingly, the substrate on which an electronic device is formed is hardly affected by the heat generated by the electromagnetic wave while only the temperature of a material having an electromagnetic wave absorbing function can be raised in a short time. For example, when a material having a strong absorbing power is used for an electrode of a transistor element, the electrode itself and an adjoining thin film of a metal oxide semiconductor precursor area, for example, can be instantly heated. Accordingly, it is possible to transform the precursor to a semiconductor quickly. Further, the temperature and heating duration can be controlled by the power and irradiation time of the microwave and it is possible to adjust them according to the substrate material.

When a metal oxide having an electromagnetic wave absorbing function is used as an electrode material precursor, a layer made of metal oxide particles may further be formed in combination (a metal does not absorb electromagnetic waves), for example, an electrode material precursor area containing ITO particles and metal oxide particles may be formed along an electrode pattern to form an electrode precursor layers or, for example, on an electrode material precursor layer containing metal oxide particles, a layer of a material having an electromagnetic wave absorbing function may be formed to obtain an electrode precursor layer. Such an electrode precursor layer is irradiated with an electromagnetic wave to obtain an electrode material.

One aspect of the present invention has been described above, in which a thermal conversion material in a functional layer is transformed into a functional material by applying a material having an electromagnetic wave absorbing function as a gate electrode. Further, it is also possible, for example, in a thin film transistor, that the material having an electromagnetic wave absorbing function is applied, for example, in a source electrode or in a drain electrode to form a thin film transistor by transferring the thermal conversion material into a functional material. These aspects will be specifically explained in the EXAMPLES.

(Irradiation of an Electromagnetic Wave)

In the present invention, for example, ultraviolet light (laser), a millimeter wave, a microwave are cited as electromagnetic waves. Of these, preferable is a microwave and irradiation of a microwave is preferably conducted, while large area application is difficult for ultraviolet laser, and a large power transmitter is difficult to obtain. Namely, after forming thin films containing source and drain electrode patterns having an electromagnetic wave absorbing function and a metal which is a metal oxide semiconductor precursor, these thin films are irradiated with an electromagnetic wave, specifically, a microwave (frequency of 0.3 GHz-50 GHz), whereby electrode patterns and a metal oxide semiconductor are manufactured by heating the electrode patterns and adjoining metal oxide semiconductor precursor by the heat generated from inside of the electrode pattern thin films having an electromagnetic wave absorbing function by themselves.

When a thin film containing a metal oxide semiconductor precursor is heated together with an electrode precursor pattern having an electromagnetic wave absorbing function of the present invention, the microwave is preferably irradiated under existence of oxygen in order to proceed the oxidation of the metal oxide semiconductor material precursor in a short time.

The heating temperature is preferably 50° C.-400° C. While a microwave is irradiated, not a small amount of heat may be transferred to the substrate due to thermal conduction. Accordingly, specifically, when a substrate having a low heat-resistance such as a resin substrate is used, it is still more preferable to carry out the treatment so that the temperature of the surface of the thin film containing a precursor is controlled within 100° C.-300° C. by controlling the power, the duration of irradiation and the number of times of irradiation. The temperature of the thin film surface and the temperature of a substrate can be measured with a surface thermometer having a thermocouple.

It is also preferable that the thin film after formed containing a metal oxide semiconductor precursor is subjected to a dry cleaning process, such as oxygen plasma and UV ozone cleaning, before microwave irradiation, to wash to decompose and clean the organic substance which exists in the inside and on the surface of the thin film, which may become a cause of impurity, whereby the organic substance other than the metal component is eliminated.

Generally a microwave refers to an electromagnetic wave within the frequency range of 0.3 GHz-50 GHz. All of the following electromagnetic waves; 0.8 GHz and 1.5 GHz bands for mobile-phone communication, 2 GHz band for ham radio, 1.2 GHz band for aircraft radar, 2.4 GHz band for, for example, microwave oven, premises wireless and VICS, 3 GHz band for marine vessel radar and 5.6 GHz band for ETC are included in the category of a microwave. Oscillators providing such as 28 GHz and 50 GHz are commercially available.

It has been already well-known to use such an electromagnetic wave for sintering in the field of ceramics. When a material including magnetism is irradiated with an electromagnetic wave, generation of heat occurs according to the magnitude of the loss of the complex magnetic permeability of the material. Applying this heat, the temperature of the material can be uniformly elevated in a short time. On the other hand, when a metal is irradiated with a microwave, arc discharge occurs since free electrons move with a high frequency, whereby it is also well-known that no heating effect is obtained. However, no example of the application of an electromagnetic wave to the electronic device manufacturing.

Based on such a background, the present inventors have found that the precursor of a metal oxide semiconductor in addition to an electrode precursor material having an electromagnetic wave absorbing function of the present invention can be simultaneously heated to an elevated temperature in a short time and can be simultaneously converted into an electrode material and a metal oxide semiconductor, respectively. What is different from the field of ceramics is that the metal oxide semiconductor precursor such as a solution containing metal ions has almost no magnetism. Accordingly it is assumed that the heat generation is mainly due to the loss factor relating to the motion of electrons and/or dipoles such as a Joule loss and/or a dielectric loss, however, the reason why such a phenomenon is observed in a thin film obtained merely by coating/drying a solution containing a metal ion is not fully clear.

The abovementioned thin films containing the electrode pattern and the metal oxide precursor do not have to be formed by coating, however, in the present invention, it is preferable to form them by coating because the electrode formation by coating and the semiconductor formation by coating can be conducted in one manufacturing process, whereby improvement in manufacturing efficiency can be attained in the manufacturing of a thin film transistor.

(Material Having Electromagnetic Wave Absorbing Function)

In the present invention, as a material having electromagnetic wave absorbing function, one example includes metal oxide particulates, preferable examples of which include indium oxide, tin oxide, zinc oxide, IZO and ITO. It is preferable that the oxides containing at least In and Sn are included. Conductors containing these oxides are preferable because they have an electromagnetic wave absorbing function. In the present invention, these materials having an electromagnetic wave absorbing function can be used as an electrode.

In an ITO film obtained by doping tin into indium oxide, the atomic ratio of In:Sn of the ITO film is preferably adjusted within 100:0.5 to 100:10. The atomic ratio of In:Sn can be determined by an XPS measurement. Further, for example, a transparent conductive film obtained by doping fluorine into tin oxide (the atomic ratio of Sn:F is in the range of 100:0.01 to 100:5, it is called an FTO film) and an $In_2O_3$—ZnO system amorphous conductive film (the atomic ratio of In:Zn is in the range of 100:50-100:5) are also applicable. The atomic ratio can be obtained by an XPS measurement.

The conductive thin film containing metal oxide particulates having an electromagnetic wave absorbing function is also preferably formed by using vacuum evaporation or a sputtering technique or it is also preferable to form via a plasma CVD method using organometallic compounds, such as a metal alkoxide or an alkyl metal of indium or tin, or a coating method such as a sol-gel method using an metal alkoxide of indium or tin, by which an ITO film having a specific resistance of $10^{-4}$ Ω·cm order is obtained. An electrode pattern is obtained combining with a suitable patterning method.

The material having an electromagnetic wave absorbing function may be a thin film of, for example, conductive IZO or ITO formed by vacuum evaporation or sputtering as described above. The material having an electromagnetic wave absorbing function may also be an electrode precursor material in which metal oxide particles containing at least oxides of In, Sn are dispersed. In this case, after the film is formed, a conductor is obtained by calcination. Accordingly, the electrode precursor area is formed by a coating method such as an inkjet method along an electrode pattern, and then calcinated to form an electrode material. The calcination is preferably carried out by microwave irradiation.

As a dispersion of the metal oxide particles which contains the oxides of at leased In, Sn, ITO particulates are specifically preferable since the particles are very minute and highly dispersed.

These metal oxide particles are obtained by heating or calcinating at a lower temperature, for example, a gel like material obtained by heating a solution while the pH value is adjusted. The coating liquid (ink) obtained by dispersing these metal oxide particles in water or in an appropriated solvent such as alcohol contains particles which do not cause clogging when used for coating, inkjet or printing and are preferable because the particles are highly dispersed.

The diameter of such particles is preferably in the range of 5 nm-50 nm.

These particles are commercially available and can be directly obtained from the market. For example, NanoTek Slurry ITO, and $SnO_2$ produced by C.I. KASEI CO., LTD. can be cited.

When such a particle dispersion is applied as an electrode material precursor, an electrode material such as ITO can be easily patterned by a coating method, for example, an inkjet method, without using such as a sputtering method and crystallization of the particles can be attained by a heat treatment or sintering at a relatively low temperature of the thin film surface of 100° C. to 300° C., whereby a highly conductive thin film can be obtained.

As an electrode precursor material, at least compounds containing In, Sn, Zn atoms, and metal salts, halogenated metal compounds and organometallic compounds containing these metal atoms can be cited.

For example, nitrates and acetates can be preferably used as metal salts containing at least In, Sn, Zn, and as halogenated metal compounds, for example, chlorides, iodides and bromides can be preferably used.

Among the above electrode material precursors, nitrates, halides and alkoxides of indium, tin and zinc are preferable. Specific examples include: indium nitrate, tin nitrate, zinc nitrates, indium chloride, tin chloride (divalent), tin chloride (tetravalent), zinc chloride, tri-i-propoxy indium, diethoxy zinc, bis(dipivaloymethanate) zinc, tetraethoxy tin and tetra-i-propoxy tin.

Using these electrode material precursors, for example, indium nitrate and tin nitrate, an electrode precursor area is formed along the electrode pattern on the above substrate. By irradiating an electromagnetic wave as described above, the electrode material precursor itself is catalytically transformed into an electrode material containing a metal oxide and further provides heat to the neighboring insulator film precursor area to transform it into an insulator film, since the metal oxide partially formed in the electrode material precursor works as a heat source.

(Semiconductor Precursor Material)

In the present invention, a metal oxide semiconductor precursor and an organic semiconductor precursor material can also be used as a semiconductor precursor which is a thermal conversion material.

As a metal oxide semiconductor precursor, a compound containing a metal atom is cited, and for example, a metal salt, a halogenated metal compound, an organometallic compound, containing a metal atom can be cited as a compound containing a metal atom.

Examples of a metal of the metal salt, halogenated metal compound and organometallic compound include: Li, Be, B, Na, Mg, Al, Si, K, Ca, Sc, Ti, V, Cr, Mn, Fe, Co, nickel, Cur Zn, Ga, Ge, Rb, Sr, Y, Zr, Nb, Mo, Cd, In, Ir, Sn, Sb, Cs, Ba, La, Hf, Ta, W, Tl, Pb, Bi, Ce, Pr, Nd, Pm, Eu, Gd, Tb, Dy, Ho, Er, Tm, Yb and Lu.

Of these metal salts, one metal ion of indium, tin and zinc is preferably included, and these metal ions may be used in combination as a mixture.

As other metal, gallium or aluminum is preferably contained.

For example, a nitrate and an acetate as a metal salt, and a chloride, an iodide and a bromide as a halogenated metal compound can be preferably used.

As an organometallic compound, a compound represented by Formula (I) is cited.

$$R^1_x MR^2_y R^3_z \qquad \text{Formula (I)}$$

In the formula, M represents a metal; $R^1$ represents an alkyl group; $R^2$ represents an alkoxy group; and $R^3$ is a group selected from a β-diketone complex group, a β-ketocarboxylate complex group, a β-ketocarboxylic acid complex group and a keto oxy group (a keto oxy complex group) when the valence of Metal M is represented by m, x+y+z=m, x=0 to m or x=0 to m−1, y=0 to m and z=0 to m, and each is 0 or a positive integer. Examples of an alkyl group of $R^1$ include: a methyl group, an ethyl group, a propyl group and a butyl group. Examples of an alkoxy group of $R^2$ include: a methoxy group, an ethoxy group, a propoxy group, a butoxy group and 3,3,3-trifluoropropoxy group. A hydrogen atom of the alkyl group may be replaced with a fluorine atom. Examples of $R^3$ which is a group selected from a β-diketone complex group, a β-ketocarboxylate complex group, a β-ketocarboxylic acid complex group and a keto oxy group (a keto oxy complex group) include: as a β-diketone complex group, 2,4-pentanedione (also called as acetylacetone or aceto acetone), 1,1,1,5,5,5-hexamethyl-2,4-pentanedione, 2,2,6,6-tetramethyl-3,5-heptanedione and 1,1,1-trifluoro-2,4-pentanedione; as a β-ketocarboxylate complex group, acetoaceticmethyl acetate, acetoethyl acetate, acetopropyl acetate, trimethylethyl acetoacetate and trifluoromethyl acetoacetate; as a β-ketocarboxylic acid, acetoacetic acid and trimethyl acetoacetic acid; and as a keto oxy group, an acetooxy group (or an acetoxy group), a propionyloxy group, a butyryloxy group, an acryloyloxy group and a methacryloyloxy group. As for the number of carbon atoms of these groups, 18 or less are preferable. These groups may be a straight chain or a branched chain, and a hydrogen atom may be replaced with a fluorine atom. In an organometallic compound, at least one or more oxygen is preferably contained in the molecule. As an example of such a compound, most preferable is an organometallic compound having at least one alkoxy group represented by $R^2$ or an organometallic compound having one group selected from a β-diketone complex group, a β-ketocarboxylate complex group, a β-ketocarboxylic acid complex group and a keto oxy group (a keto oxy complex group) represented by $R^3$. Among the metal salt, a nitrate is preferable. A high-purity compound can be easily obtained for a nitrate, and its solubility to water is high, water being a favorable medium for use. Examples of a nitrate include: indium nitrate, tin nitrate, zinc nitrate and gallium nitrate.

A metal nitrate, a metal halides, and an alkoxide are preferable among the above metal oxide semiconductor precursors. Specific examples thereof include: indium nitrate, zinc nitrate, gallium nitrate, tin nitrate, aluminum nitrate, indium chloride, zinc chloride, gallium nitrate, tin nitrate, zinc nitrate, gallium nitrate, tin chloride (divalent), tin chloride (tetravalent), gallium chloride, aluminum chloride, tri-i-propoxy indium, diethoxy zinc, bis(dipivaloylmethanate) zinc, tetraethoxy tin, tetra-i-propoxy tin, tri-i-propoxy gallium and a tri-i-propoxy aluminum.

(The Film Forming Method of a Metal Oxide Semiconductor Precursor Thin Film, Patterning Method)

In order to form the thin film containing a metal used as the precursor of these metal oxide semiconductors, for example, a well-known film forming method, a vacuum evaporation method, molecular beam epitaxy, an ion cluster beam method, a low energy ion beam method, an ion-plating method, CVD, a sputtering method and an atmospheric-pressure plasma method can be used, however, in the present invention, manufacturing efficiency can be largely improved by coating a solution of, for example, a metal salt, a halide or an organometallic compound dissolved in an appropriate solvent continuously on a substrate. Also in this point of view, it is more preferable to use, for example, a chloride, a nitrate, an acetate, a metal alkoxide, with respect to the solubility.

The solvent including water is not specifically limited as far as it can dissolve a metal compound to be used. Examples of a solvent preferably used in the present invention include: water; alcohols such as ethanol, propanol and ethylene glycol; ethers such as tetrahydrofuran and dioxane; esters such as methyl acetate and ethyl acetate; ketones such as acetone, methylethyl ketone and cyclohexanone; glycohol ethers such as diethylene glycol monomethyl ether; acetonitrile; aromatic hydrocarbons such as xylene and toluene; aromatic solvents such as o-dichlorobenzene, nitrobenzene, and m-cresol; aliphatic hydrocarbon solvents such as hexane, cyclohexane and tridecane; halogenated alkyl solvents such as α-terpineol, chloroform and 1,2-dichloroethane; N-methylpyrolidone; and carbon sulfide.

In the present invention, the solvent used for a metal atom containing compound such as a metal salt, a halogenated metallic compound and an organometallic compound is not specifically limited as far as it can dissolve the metal atom containing compound, however, water and a lower alcohol are preferable with in view of the solubility of the metal salt and the drying characteristic after coating. Among the lower alcohols, methanol, ethanol and propanol (1-propanol and isopropanol) are preferable in view of the drying characteristics. The alcohol may be used alone or may be used as a mixture with water in an arbitrary ratio. In view of the solubility and the solution stability, it is preferable to prepare an aqueous solution by mixing water and a lower alcohol. It is preferable to prepare an aqueous solution by mixing water and a lower alcohol because the surface tension can be lowered without drastically changing the composition, whereby ejecting property of an inkjet ink is improved. In view of the drying characteristics and ejecting property, a lower alcohol is preferably added in an amount of 5% by mass or more, and to satisfy both the properties (drying characteristic and ejecting property) the ratio of water/lower alcohol is preferably 5/5-5/95.

In the present invention, an aqueous solution means the solution in which a solute (in the present invention, such as a metal salt and an additive if necessary) is dissolved in a mixed solvent having a water content of 30% by mass or more based on the mass of the solvent or dissolved in water (the water content is 100% by mass). In view of the solubility of a solute such as a metal salt and the solution stability, the water content is preferably 50% by mass or more, and more preferably 70% by mass or more.

Further, it is preferable to add a chelate ligand which is a multidentate ligand, such as a various alkanolamines, α-hydroxyketone and β-diketone, in a solvent together with a metal alkoxide within the range where no deterioration occurs, because the metal alkoxide can be stabilized in the solution and the solubility of a carboxylic acid salt is improved.

Examples of a method to form a thin film by applying a liquid containing a semiconductor precursor material on a substrate include: a coating method in a broad sense, for example, coating methods such as a spin coat method, a spray coat method, a blade coat method, a dip coat method, a cast method, a bar coat method and a die coat method; and printing methods such as a letterpress method, an intaglio printing method, a planographic printing method, a screen printing method and an inkjet method, and a method of patterning using thereof. Alternatively, patterning may be conducted by photolithography or laser abrasion using the coated film. Of these, an inkjet method and a spray coat method are preferable, by which thin film coating is possible.

When forming a film, a thin film of a precursor of a metal oxide is formed by evaporating the solvent at 50° C.-about 150° C. after the application. When a solution is dropped on the substrate, the substrate itself is preferably heated at 50° C.-about 150° C., whereby the two processes of application and desiccation can be simultaneously carried out.

(Metal Composition Ratio)

With respect to the preferable metal composition ratio, when the content of Metal A is set to 1, the content of Metal B is 0.2-5 and preferably 0.5-2, the content of Metal C is 0-5 and preferably 0-2.

Metal A; In or Sn
Metal B; Ga or Al
Metal C; Zn

The thickness of the thin film containing the metal used as a precursor is 1-200 nm and more preferably 5-100 nm.

(Amorphous Oxide)

As the state of formed metal oxide semiconductor, any of a single crystal, a polycrystal, and an amorphous is applicable, however, preferable is an amorphous thin film.

As the electronic carrier concentration of the amorphous oxide which is a metal oxide concerning the present invention formed from the metal compound used as a metal oxide semiconductor precursor, acceptable electronic carrier concentration is less than $10^{18}/cm^3$. The electronic carrier concentration denotes a value measured at room temperature. The room temperature is, for example, 25° C., and specifically a value arbitrarily selected from 0° C.-about 40° C. The electronic carrier concentration of the amorphous oxide concerning the present invention does not need to satisfy less than $10^{18}/cm^3$ in all the range of 0 to 40° C., and desirable is that less than $10^{18}/cm^3$ is satisfied at 25° C. When the electronic carrier concentration is lowered further to less than $10^{17}/cm^3$, and more preferably less than $10^{16}/cm^3$, TFTs exhibiting normally-off can be manufactured with an excellent yield.

The concentration of an electronic carrier concentration can be determined by a Hall effect measurement.

The thickness of the semiconductor containing a metal oxide is not specifically limited. However, the performance of a transistor tends to be influenced by the thickness of the semiconductor layer, and the thickness is, although depending to the semiconductor, generally 1 μm or less and preferably 10-300 nm.

In the present invention, by controlling, for example, the precursor material, composition ratio, manufacturing condition, the electronic carrier concentration is controlled to be preferably $10^{12}/cm^3$ or more but less than $10^{18}/cm^3$, more preferably $10^{13}/cm^3$-$10^{17}/cm^3$ and, further more preferably $10^{15}/cm^3$-$10^{16}/cm^3$.

As an organic semiconductor precursor material, for example, a bicyclo compound (bicyclo porphyrin compound) which has a cyclic structure as disclosed in the abovementioned JP-A No. 2003-304014, may be cited. When a thin film formed of such a compound is heated, a deethylenation reaction advances, and a high flatness tetrabenzoporphyrin film is obtained, whereby a high efficiency organic semiconductor film is formed. By employing such bicyclo porphyrin compound or a metal complex thereof as a semiconductor precursor, similarly, a high flatness organic semiconductor layer can be formed due to the heat generated by the electromagnetic wave absorption of the ITO electrode.

Specific examples of these bicycloes porphyrin compounds are disclosed in paragraphs (0022)-(0025) of JP-A No. 2003-304014, and these compounds, or, for example, a metal complex of such as copper is usable. A specific example will be shown below.

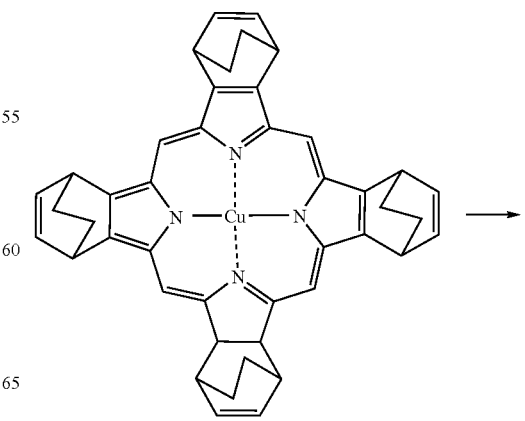

-continued

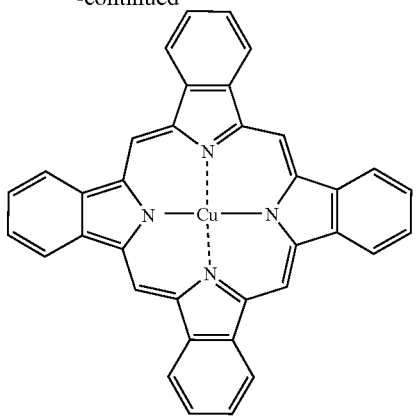

These bicyclo compounds may also be dissolved in a solvent and may be coated, if necessary. A compound of which deethylenated product shows a poor solubility in a solvent is preferable.

Examples of a method of coating include: a coating method in a broad sense, for example, coating methods such as a casting method, a spin coat method, a spray coat method, a blade coat method, a dip coat method, a bar coat method and a die coat method; and printing methods such as a flexographic printing method, an intaglio printing method, a planographic printing method, a screen printing method and an inkjet method, and a method of patterning using thereof. Alternatively, patterning may be conducted by photolithography or laser abrasion using the coated film.

According to the present invention, formation of, for example, an electrode can be conducted by a coating process (a wet process) including the printing method and the inkjet method. Further, since a semiconductor layer can also be formed by a coating method using a semiconductor material precursor, the electrode formation by a coating method and the semiconductor formation by a coating method can be conducted in one manufacturing process, whereby improvement in manufacturing efficiency can be attained in the manufacturing of a thin film transistor.

(Other Semiconductor Layer)

In the present invention, when an insulating layer is formed by using a thermal conversion material for each of the electrode and the insulating layer precursor, the semiconductor layer may be formed by a known method.

For example, the semiconductor layer may not be formed by the method of the present invention in which the insulating layer is formed by using a material having an electromagnetic wave absorbing function as the electrode, and by using the electrode as a heat source via irradiation of a microwave. The semiconductor layer may be formed by forming a semiconductor precursor area using the abovementioned metal oxide semiconductor precursor, and by thermally oxidizing the precursor area via thermal oxidation, plasma oxidation or UV irradiation under existence of oxygen.

For example, when plasma oxidation is used, an atmospheric pressure plasma method is preferably used. The plasma oxidation is carried out by the following steps: heating a substrate having thereon a thin film containing a precursor at a temperature of 150° C.-300° C.; introducing an inert gas such as argon or nitrogen as a discharge gas, together with a reactive gas (the reactive gas containing oxygen) into a discharge space under an atmospheric pressure; applying a high frequency electric field to excite the discharge gas, whereby plasma is generated; contacting the reactive gas with the plasma to generate oxygen plasma; and exposing the substrate surface to the oxygen plasma, whereby the semiconductor precursor material is oxidized. The atmospheric pressure represents a pressure of 20-110 kPa and preferably a pressure of 93-104 kPa.

When generating oxygen plasma by the atmospheric-pressure plasma method, using an oxygen containing gas as a reactive gas, the gas to be used depends on the kind of a thin film, however, it is fundamentally a mixed gas of a discharge gas (inert gas) and an oxidative gas. When plasma oxidation is carried out, as an oxidative gas, oxygen gas is preferably contained in the amount of 0.01-10% by volume, more preferably 0.1-10% by volume and furthermore preferably 0.1-5% by volume, based on the volume of the mixed gas.

As the abovementioned inert gas, cited are Group 18 elements of the periodic table, specifically, helium, neon, argon, krypton, xenon, and radon, as well as nitrogen. Of these, helium, argon and nitrogen are preferably used.

The atmospheric pressure plasma method is disclosed in, for example, JP-A Nos. 11-61406, 11-133205, 2000-121804, 2000-147209 and 2000-185362, and WO2006/129461.

(Other Organic Semiconductor Layer)

When the abovementioned semiconductor layer formed by a known method is used, an organic semiconductor layer may be used as the semiconductor layer.

As organic semiconductor materials, various condensed polycyclic aromatic compounds or conjugated compounds described below are applicable.

Examples of the condensed polycyclic aromatic compounds serving as organic semiconductor materials include compounds such as anthracene, tetracene, pentacene, hexacene, heptacene, chrysene, pysene, fuluminene, pyrene, peropyrene, perylene, terylene, quoterylene, coronene, ovalene, circumanthracene, bisanthene, sesulene, heptasesulene, pyranthrene, violanthene, isoviolanthene, circobiphenyl, phthalocyanine, and porphyrin, as well as derivatives thereof.

Examples of the conjugated compounds include polythiophene and oligomers thereof, polypyrrole and oligomers thereof, polyaniline, polyphenylene and oligomers thereof, polyphenylene vinylene and oligomers thereof, polythienylene vinylene and oligomers thereof, polyacetylene, polydiacetylene, tetrathiafluvalene compounds, quinone compounds, cyano compounds such as tetracyanoquinodimethane, and fullerene, as well as derivatives and mixtures thereof.

Further, specifically, of polythiophene and oligomers thereof, there may preferably be used oligomers featuring a thiophene hexamer structure such as α-sexithiophene, α,ω-dihexyl-α-sexithiophene, α, ω-dihexyl-α-quinquethiophene, or α,ω-bis(3-butoxypropyl)-α-sexithiophene.

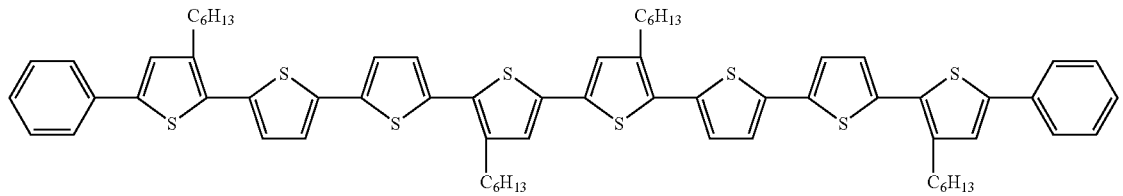

Still further, there are listed metal phthalocyanines such as copper phthalocyanine, or fluorine-substituted copper phthalocyanine described in JP-A No. 11-251601; condensed ring tetracarboxylic acid dimides including naphthalenetetracarboxylic acid dimides such as naphthalene-1,4,5,8-tetracarboxylic acid diimide, N,N'-bis(4-trifluoromethylbenzyl) naphthalene-1,4,5,8-tetracarboxylic acid diimide, as well as N,N'-bis(1H,1H-perfluorooctyl), N,N'-bis(1H,1H-perfluorobutyl), and N,N'-dioctylnaphthalene-1,4,5,8-tetracarboxylic acid diimide derivatives, or naphthalene-2,3,6,7-tetracarboxylic acid diimide, and anthracenetetracarboxylic acid diimides such as anthracene-2,3,6,7-tetracarboxylic acid diimide; fullerenes such as $C_{60}$, $C_{70}$, $C_{76}$, $C_{78}$, or $C_{84}$; carbon nanotubes such as SWNT; and dyes such as merocyanine dyes or hemicyanine dyes.

Of these π-conjugated materials, preferable is at least one type selected from the group including condensed polycyclic aromatic compounds such as pentacene, fullerenes, condensed ring tetracarboxylic acid diimides, and metal phthalocyanines.

Of these π-conjugated materials, preferable is at least one type selected from the group including condensed polycyclic aromatic compounds such as pentacene, fullerenes, condensed ring tetracarboxylic acid diimides, and metal phthalocyanines.

As an organic semiconductor material, the compound represented by the following Formula (OSC1) is preferably used.

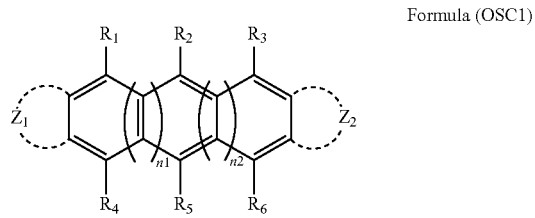

Formula (OSC1)

wherein $R_1$-$R_6$ each represent a hydrogen atom or a substituent, $Z_1$ and $Z_2$ each represent a group of atoms to form a substituted or unsubstituted aromatic hydrocarbon ring, or a substituted or unsubstituted aromatic heterocyclic ring, and n1 and n2 each represent an integer of 0-3.

In Formula (OSC1), the substituents represented by each of $R_1$-$R_6$ include an alkyl group (for example, a methyl group, an ethyl group, a propyl group, an isopropyl group, a tert-butyl group, a pentyl group, a tert-pentyl group, a hexyl group, an octyl group, a tert-octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group, an allyl group, a 1-propenyl group, a 2-butenyl group, a 1,3-butadienyl group, a 2-pentetyl group, and an isopropenyl group), an alkynyl group (for example, an ethynyl group and a propagyl group), an aromatic hydrocarbon group (an aromatic hydrocarbon group, also called an aryl group, for example, a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenyl group), an aromatic heterocyclyl group (also called a heteroaryl group, for example, a pyridyl group, a pyrimidyl group, a furyl group, a pyrrolyl group, an imidazolyl group, a benzimidazolyl group, a pyrazolyl group, a pyrazinyl group, a triazolyl group (for example, a 1,2,4-triazole-1-yl group and a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolinyl group, diazacarbazolyl group (which shows one in which one of carbon atoms constituting the carbon ring of the above carbolinyl group is replaced with a nitrogen atom), a quinoxalynyl group, a pyridazinyl group, a triazinyl group, a quinazolynyl group, and a phthalazinyl group), a heterocyclyl group (for example, a pyrrolidyl group, an imidazolydyl group, a morpholyl group, and an oxazolydyl group), an alkoxy group for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group) a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group, and a dodecylsulfonyl group), an arylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), an halogen atom (for example, a fluorine atom, a chlorine atom, and a bromine atom), a fluorinated hydrocarbon group (for example, a fluoromethyl group, a trifluoromethyl group, and a pentafluoroethyl group), a cyano group, a nitro group, a hydroxyl group, a mercapto group, a silyl group (for example, a trimethylsilyl group, a triisopropylsilyl group, a triphenylsilyl group, and a phenyldiethylsilyl group).

These substituents may further be substituted with the above substituents, and a plurality of the above substituents may join to form a ring.

In Formula (OSC1), the aromatic hydrocarbon group or aromatic heterocyclic group represented by $Z_1$ and $Z_2$ each are the same, respectively, as the aromatic hydrocarbon group and the aromatic heterocyclic group described as the substituent represented by each of above $R_1$-$R_6$.

Further preferred are the compounds represented by following Formula (OSC2).

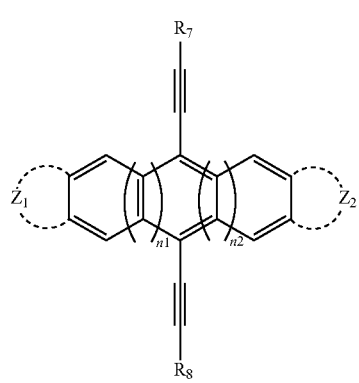

Formula (OSC2)

wherein $R_7$ and $R_8$ each represent a hydrogen atom or a substituent, $Z_1$ and $Z_2$ each represent a group of atoms to form a substituted or unsubstituted aromatic hydrocarbon ring, or a substituted or unsubstituted aromatic heterocyclyl ring, and n1 and n2 each represent an integer of 0-3.

In Formula (OSC2), the substituent represented by $R_7$ and $R_8$ each are the same as defined for the substituents represented by each of above $R_1$-$R_6$. Further, the aromatic hydrocarbon group or aromatic heterocyclyl group represented by $Z_1$ and $Z_2$ each are the same as the aromatic hydrocarbon group and the aromatic heterocyclyl group described as the substituent represented by each of above $R_1$-$R_6$.

In above Formula (OSC2), it is preferable that substituents $R_7$ and $R_8$ are represented by Formula (SG1).

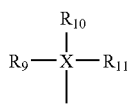

Formula (SG1)

wherein $R_9$-$R_{11}$ each represent a substituent, and X represents silicon (Si), germanium (Ce), or tin (Sn).

In above Formula (SG1), the substituents represented by $R_9$-$R_{11}$ each are the same as defined for the substituents represented by $R_1$-$R_3$ in above Formula (OSC1).

Specific examples of the compounds represented by above Formula (OSC2) are listed below; however, the present invention is not limited thereto.

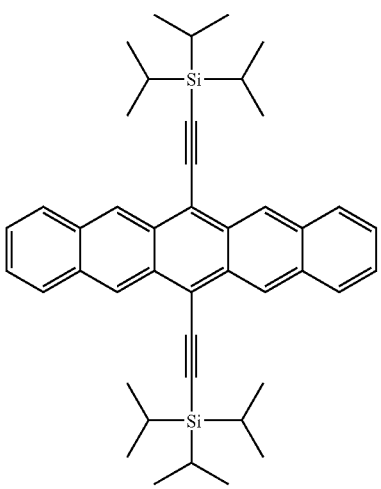

OSC2-1

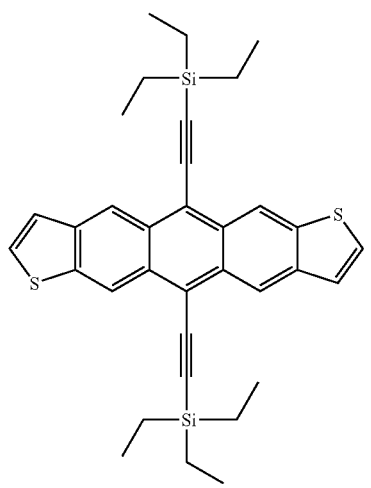

OSC2-2

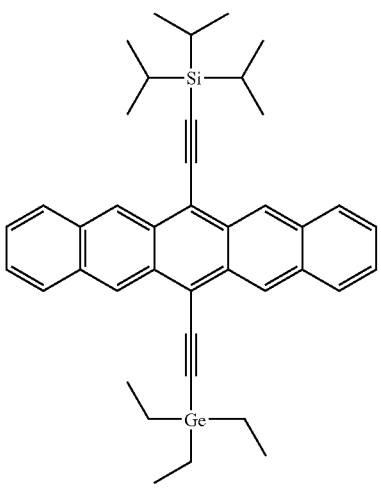

OSC2-3

OSC2-4
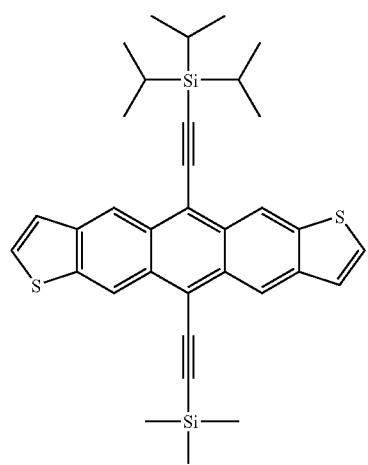
OSC2-5
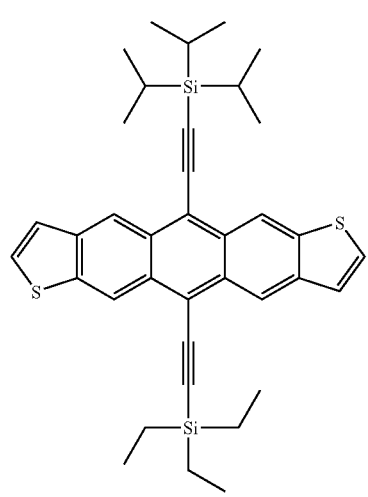
OSC2-6
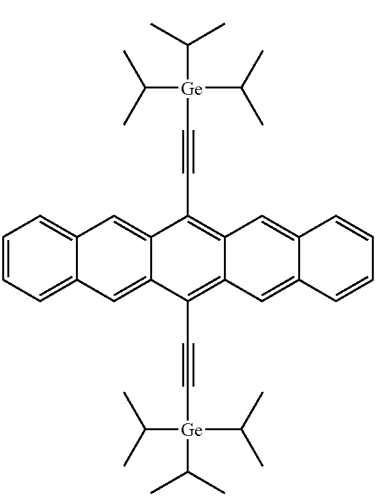
OSC2-7
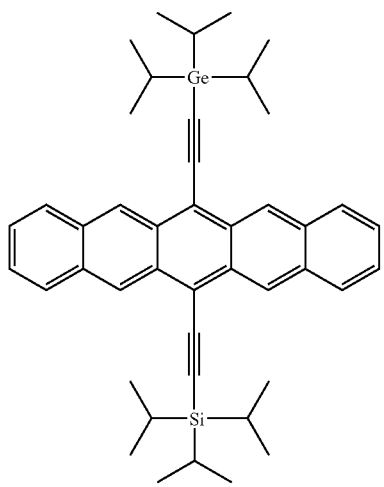
OSC2-8
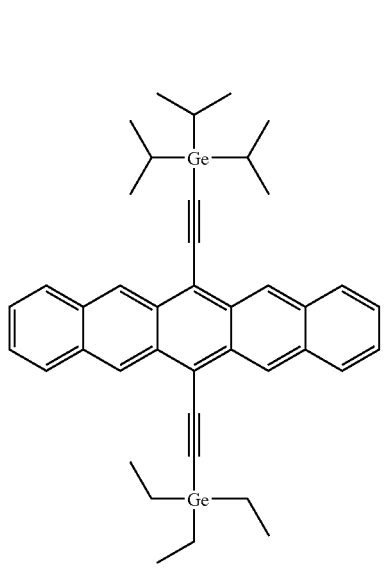
OSC2-9
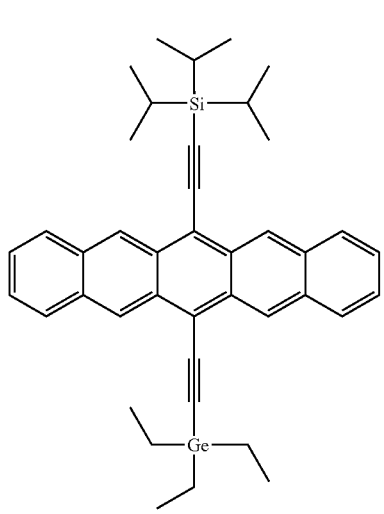

-continued

OSC2-10

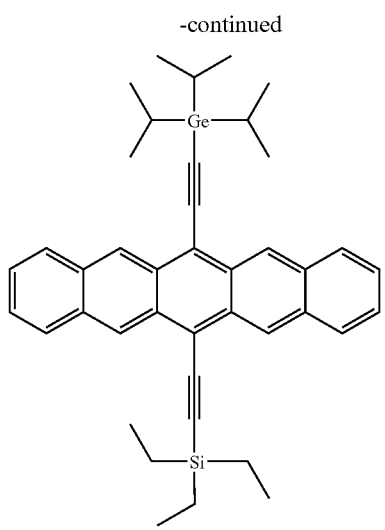

Further, as an organic semiconductor material, compounds reported in the following documents are applicable: J. Am. Chem. Soc., 2006, Vol. 128, p 12604, J. Am. Chem. Soc., 2007, Vol. 129, p 2224, and Liquid Crystals, 2003, Vol. 30, pp 603-610.

Further, in the present invention, the organic semiconductor layer may be incorporated with: materials having a functional group, for example, acrylic acid, acetamide, a dimethylamino group, a cyano group, a carboxyl group and a nitro group; materials which function as an acceptor accepting electrons such as a benzoquinone derivative, tetracyanoethylene, tetracyanoquinodimethane or derivatives thereof; materials having a functional group such as an amino group, a triphenyl group, an alkyl group, a hydroxyl group, an alkoxy group or a phenyl group; materials which function as a donor donating electrons such as substituted amines such as phenylenediamine, anthracene, benzanthracene, and substituted anthracenes, pyrene, substituted pyrene, carbazole and derivatives thereof, or tetrathiafulvalene and derivatives thereof, whereby a so-called doping treatment is carried out.

Doping, as described above, refers to introduction of electron accepting molecules (acceptors) or electron donating molecules (donors) into the thin film as a dopant. Accordingly, a thin film which has undergone doping is one which incorporates the above condensed polycyclic aromatic compounds and dopants. Employed as dopants in the present invention may be those commonly known in the art.

As a method of forming these organic semiconductor layers, well known methods are applicable, for example, cited are a vacuum evaporation method, MBE (Molecular Beam Epitaxy), an ion cluster beam method, a low energy ion beam method, an ion plating method, a sputtering method, CVD (Chemical Vapor Deposition), a laser evaporation method, an electron beam evaporation method, an electrodeposition method, a casting method using a solution, a spin coat method, a dip coat method, a bar coat method, a die coat method, a spray coat method, and an LB method, and also cited are a screen printing method, an ink jet printing method and a blade application method.

Among the above methods, preferable examples include: a spin coat method, a blade coat method, a dip coat method, a roll coat method, a bar coat method and a die coat method, which enable forming a thin film simply and precisely using a solution of the organic semiconductor, with respect to manufacturing efficiency. Specifically, when an organic semiconductor layer is formed according to the pattern forming method of the present invention, it is preferable that an organic semiconductor solution is coated.

The organic solvent used when producing an organic semiconductor solution is preferably aromatic hydrocarbon, a halogenated aromatic hydrocarbon, an aliphatic hydrocarbon, or a halogenated aliphatic hydrocarbon, and more preferably an aromatic hydrocarbon, a halogenated aromatic hydrocarbon, or an aliphatic hydrocarbon.

Examples of an organic solvent of an aromatic hydrocarbon include: toluene, xylene, mesitylene and methylnaphthalene, however, the present invention is not limited thereto.

Examples of a aliphatic hydrocarbon include: octane, 4-methylheptane, 2-methylheptane, 3-methylheptane, 2,2-dimethylhexane, 2,3-dimethylhexane, 2,4-dimethylhexane, 2,5-dimethylhexane cyclohexane, cyclopentane and methylcyclohexane, however, the present invention is not limited thereto.

Examples of an organic solvent of a halogenated aliphatic hydrocarbon include: chloroform, bromoform, dichloromethane, dichloroethane, trichloroethane, difluoro ethane, fluorochloroethane, chloropropane, dichloropropane, chloropentane and chlorohexane, however, the present invention is not limited thereto.

In the present invention, the organic solvent may contain one kind or may be a mixture of two kinds or more. The organic solvent preferably has a boiling point of 50° C.-250° C.

In addition, as reported in Advanced Material (1999), Vol. 6, p 480-483, when a precursor is soluble in a solvent such as pentacene, a film of such a precursor formed by a coating method may be heat treated to obtain a thin film of desired organic material.

The thickness of the organic semiconductor layer is not specifically limited, however, the characteristics of an obtained transistor is often influenced greatly by the coating thickness of the organic semiconductor layer. Accordingly, the thickness is generally 1 μm or less, and specifically preferably 10-300 nm, although the preferable thickness depends on the organic semiconductor.

Further, by forming at least one of the gate electrode, and sources/drain electrodes according to the manufacturing method of the organic semiconductor device of the present invention, it becomes possible to form a low resistance electrode without deterioration of the performance of the organic semiconductor layer since no high temperature is needed.

In the process of forming an organic semiconductor layer, it is preferable to carry out a surface treatment before the formation of an organic semiconductor layer. The surface treatment is carried out using an organic material on a portion where the organic semiconductor layer is to be formed on the substrate surface on which, for example, an insulating layer or a subbing layer containing, for example, a metal oxide is formed. In the surface treatment using an organic substance, a material which can be physically adsorbed or a surfactant may be used. Specifically preferable is a material which forms a monomolecular layer via physical or chemical adsorption, on the substrate surface on which, for example, an insulating layer is formed. Of these, a surface treatment using a silane coupling agent is specifically preferable. A silane coupling agent forms a monomolecular film on a metal oxide surface of an insulating layer, by forming a chemical bond.

Specifically, preferable examples of a silane coupling agent include: coupling agents such as octyltrichlorosilane, octadecyltrichlorosilane, phenyltrichlorosilane and octyltriethoxysilane; silazanes such as hexamethyldisilazane; and the following compounds.

ST-1
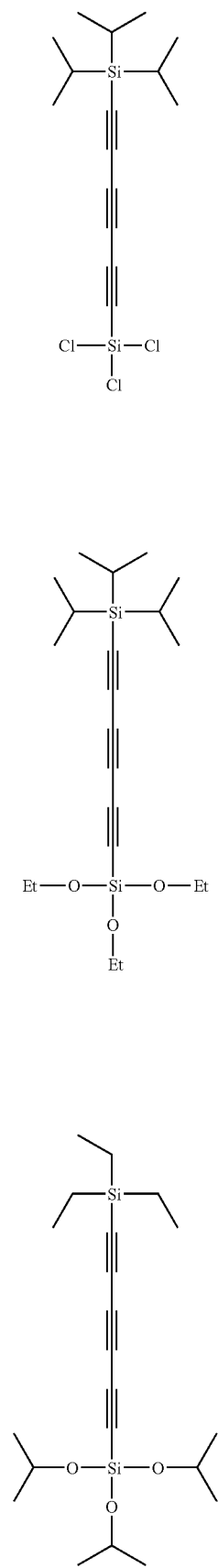
ST-2
ST-3
ST-4
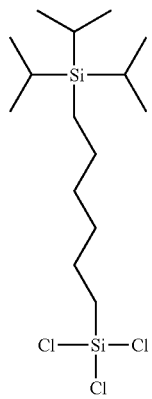
ST-5
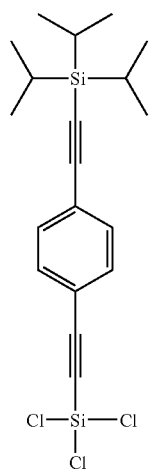
ST-6
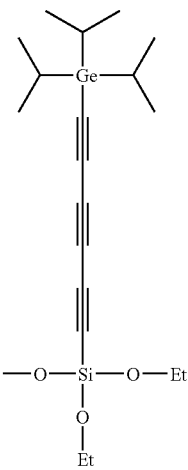
ST-7
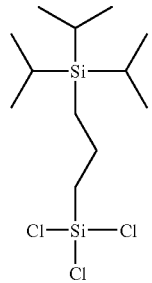

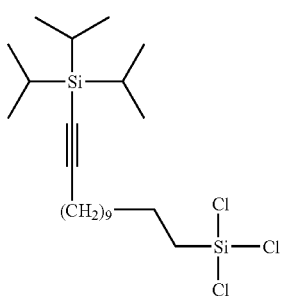

ST-8

Further, the surface treatment using a titanium coupling agent such as octyltrichloro-titanium or octyltriisopropoxy-titanium is also preferable.

Subsequently, each of other component which constitutes a thin film transistor will be described below.

(Electrode)

In the present invention, as a conductive material used for such as the source electrode, the drain electrode and the gate electrode of a TFT device, other electrode material may be used besides the electrodes having an electromagnetic wave absorbing function formed via the abovementioned method, for example, the conductive metal oxide material. For example, after forming a gate electrode and a gate insulating layer by the method of the present invention via microwave irradiation according to the 1st aspect, the source and the drain electrodes may not necessarily be formed based on the same method.

Alternatively, even when using electrode materials having an electromagnetic wave absorbing function for source and drain electrodes to transform a semiconductor precursor material to a semiconductor layer, there is no limitation on, for example, the electrode material of a gate electrode.

As other electrode material, any material is usable as far as having a practically acceptable conductivity as an electrode, and thus it is not specifically limited. Examples of such an electrode material include: platinum, gold, silver, nickel, chromium, copper, iron, tin, antimonial lead, tantalum, indium, palladium, tellurium, rhenium, iridium, aluminum, ruthenium, germanium, molybdenum, tungsten, tin-antimony oxide, indium-tin oxide (ITO), fluorine doped zinc, zinc, carbon, graphite, glassy carbon, silver paste, carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixture, magnesium/silver mixture, magnesium/aluminum mixture, magnesium/indium mixture, aluminum/aluminum oxide mixture and lithium/aluminum mixture.

As a conductive material, a conductive polymer and a metal particle may be preferably used. As a dispersed material containing metal particles, a well-known conductive paste may be used, however, preferable is a dispersed material containing metal particles having a diameter of 1 nm-50 nm and preferably 1 nm-10 nm.

In order to form an electrode from metal particles, the abovementioned method can be similarly used and the abovementioned metal can be used as a material of metal particles.

As mentioned above, these electrode materials and the material having the abovementioned electromagnetic wave absorbing function may be used in combination as an electrode material having an electromagnetic wave absorbing function.

(Formation Methods Such as Electrode)

Examples of a forming method of these electrodes include: a method to form an electrode by patterning a conductive thin film formed via vacuum evaporation or sputtering using the abovementioned materials by means of well-known photolithography or a lift-off method; and a method to form a resist pattern, first, via a thermal transfer method or an inkjet method on a metal foil of such as aluminum or copper and then to conduct etching. Also, patterning may be carried out by an inkjet method to directly eject a solution or a dispersion of a conductive polymer or a dispersion of, for example, metal particles; or by an abrasion method or photolithography using a film formed by a coating method. Further, applicable is a method of pattering by a printing method such as letterpress, intaglio printing, planographic printing and screen printing using an ink containing a conductive polymer or metal particles.

As methods of forming electrodes such as a source, drain, or gate electrode and a gate or source busline, there are known methods via an electroless plating method as a forming method without pattering a metal thin film using a photosensitive resin via etching or lift-off.

In forming methods of electrodes via the electroless plating method, as described in JP-A No. 2004-158805, a liquid containing a plating catalyst inducing electroless plating by acting on a plating agent is patterned, for example, via a printing method (including an ink-jet method), followed by allowing the plating agent to be brought into contact with a portion where an electrode is provided. Thus, electroless plating is carried out on the above portion via contact of the catalyst with the plating agent to form an electrode pattern.

The catalyst and the plating agent may reversely be employed in such electroless plating, and also pattern formation may be conducted using either thereof. However, it is preferable to employ a method of forming a plating catalyst pattern and then applying a plating agent thereto.

As a printing method, for example, screen printing, planographic printing, letterpress, intaglio printing or inkjet printing is used.

(Gate Insulating Layer)

Various insulating films may be employed as a gate insulating layer of a thin film transistor element, when it is not used to form the oxide insulating film of the present invention. Of these, an inorganic oxide film having a relative high dielectric constant is specifically preferred. Examples of an inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium isthmus titanate, strontium bismuth tantalate, bismuth tantalate niobate, and yttrium trioxide. Of these, preferred are silicon oxide, aluminum oxide, tantalum oxide, and titanium oxide. Inorganic nitrides such as silicon nitride or aluminum nitride may also be preferably employed.

Methods to form the above film include dry processes such as a vacuum deposition method, a molecular beam epitaxial deposition method, an ion cluster beam method, a low energy ion beam method, an ion plating method, a CVD method, a sputtering method, or an atmospheric pressure plasma method, as well as wet processes such as methods employing coating such as a spray coating method, a spin coating method, a blade coating method, a dip coating method, a casting method, or a roller coating method, a bar coating method, or a die coating method, and methods employing patterning such as printing or ink-jet printing. It is possible to employ any of these method depending materials.

In the wet processes, employed may be a method in which a liquid coating composition, which is prepared by dispersing minute inorganic oxide particles into any appropriate organic solvent or water employing, if necessary, dispersing aids such as surface active agents, is coated and subsequently dried, or a so-called sol-gel method in which a solution of oxide precursors such as alkoxides is coated and subsequently dried.

Of these, preferred is the atmospheric pressure plasma method described above.

It is also preferable that the gate insulation film is composed of either an anodized film or the above anodized film and an insulation film. It is preferable that the anodized film undergoes a sealing treatment. The anodized film is formed in such a manner that anodizable metals undergo anodic oxidation via methods known in the art.

Listed as an anodizable metal may be aluminum or tantalum. Anodic treatment methods are not particularly limited, and methods known in the art are usable.

Further employed as the organic compound film may be polyimide, polyamide, polyester, polyacrylate, photo-radical polymerization based or photo-cationic polymerization based photocuring resins, or copolymers incorporating acrylonitrile components, polyvinyl phenol, polyvinyl alcohol, and novolak resins.

An inorganic oxide film and an organic oxide film may be simultaneously employed via superimposition. Further, the thickness of the above insulation film is commonly 50 nm-3 μm, but is preferably 100 nm-1 μm.

[Protective Layer]

A protective layer may be provided on an organic thin film transistor. Examples of a protective layer include: an inorganic oxide or an inorganic nitride; metal thin films such as aluminum; a polymer film having a low gas permeability; and a laminated film thereof. By providing such a protective film, the durability of an organic thin film transistor is improved. As a method to form such a protective film, the abovementioned forming method of a gate insulating layer may be employed. Also applicable is a method to merely laminating a polymer film having thereon such as a variety of inorganic oxide to provide a protective layer.

(Substrate)

Various materials are usable as support materials to constitute a substrate. For example, employed may be: ceramic substrates such as glass, quartz, aluminum oxide, sapphire, silicon nitride and silicon carbide; semiconductor substrates such as silicon, germanium, gallium arsine and gallium nitrogen; paper; and unwoven cloth. However, in the present invention, it is preferable that the substrate is composed of a resin, for example, plastic sheet film is usable. Examples of such plastic sheet film include those composed, for example, of polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), and cellulose acetate propionate (CAP). By employing a plastic film, it is possible to decrease weight compared to when a glass substrate is employed. Further, it is possible to enhance portability and durability against impact.

Further, it is possible to arrange an element protective layer on the thin film transistor element of the present invention. The above inorganic oxides or inorganic nitrides are cited as materials of the protective layer. It is preferable to form the protective layer employing the above atmospheric pressure plasma method.

(Element Constitution)

FIGS. 4(a)-4(f) illustrate typical constitutions of a thin film transistor element.

In FIG. 4(a), a field-effect transistor is formed in such a manner that source electrode 2 and drain electrode 3 are formed on support 6; while employing the resulting support as a substrate, organic semiconductor layer 1 is formed between the above electrodes; and on the resulting film, insulation layer 5 is formed and further on the above, gate electrode 4 is formed. FIG. 4(b) shows another field-effect transistor formed in such a manner that organic semiconductor layer 1, which is formed between the electrodes in FIG. 4(a), is formed employing a coating method so that all of the electrodes and the support surface are covered. In FIG. 4(c), still another field-effect transistor is formed in such a manner that initially, organic semiconductor layer 1 is formed on support 6 and subsequently, source electrode 2, drain electrode 3, insulating layer 5, and gate electrode 4 are formed.

In FIG. 4(d), after forming gate electrode 4 and insulating layer 5 on support 6, source electrode 2 and drain electrode 3 are formed, and subsequently, organic semiconductor layer 1 is formed between the above electrodes. The structures shown in FIGS. 4(e) and 4(f) may also be usable.

The present invention can be applied to the process in which the gate electrode and the insulating layer, and, further, the semiconductor layer are simultaneously formed, or to the process in which the source and drain electrodes and the semiconductor layer are simultaneously formed, among the above mentioned in the figures. Further, although not shown in the figure, the present invention can be applied to a formation process of such as a protective layer.

In the present invention, in a case of a transistor element, a bottom gate structure is preferably employed (FIGS. 4(d)-4(f)). This structure is preferable because, when a material which absorbs an electromagnetic wave is used as a gate electrode, by using it as a heat source, a plurality of layers can be simultaneously transformed from a thermal conversion material to a functional layer.

Further, a bottom contact structure in which the source/drain electrodes are provided closer to the gate electrode than the semiconductor layer is preferable (such as FIGS. 4(c) and 4(d)). This structure is preferable because the formation of the electrodes and the insulating layer including the gate, source and drain electrodes can be conducted separately from the formation of the semiconductor layer. When the condition of the transformation of the electrodes and the insulating layer is different from the condition of the formation of the semiconductor layer, each transformation can be thoroughly conducted separately.

In a top gate structure (FIGS. 4(a)-4(c)), the gate electrode is provided farer from the substrate. This structure is preferable when a plastic substrate is used because the thermal transformation or deterioration of the substrate can be reduced.

FIG. 5 shows a schematic equivalent circuit of a thin film transistor sheet which is an electronic device in which a plurality of thin film transistor elements are arranged.

The thin film transistor sheet 10 incorporates a number of thin film transistor elements 14 matrix-arranged. The symbol 11 represents a gate busline for the gate electrode of each thin film transistor element 14, and the symbol 12 represents a source busline for the source electrode of each thin film transistor element 14. The drain electrode of each organic thin film transistor element 14 is connected with an output element 16, being, for example, a liquid crystal or an electrophoretic element, which constitutes a pixel of a display device. In the illustrated example, an equivalent circuit constituted of a resistor and a capacitor shows a liquid crystal used as the output element 16. The symbols 15, 17, and 18 represent an accumulation capacitor, a vertical drive circuit, and a horizontal drive circuit, respectively.

The method of the present invention can be used for the manufacturing of such a thin film transistor seat in which TFT element are two-dimensionally arranged on a substrate.

The manufacturing method of the electronic device of the present invention may be applied to any electronic devices, for example, may be applied to an organic electroluminescence element.

An organic EL device has a structure in which an organic layer which emits light is laminated between two electrodes, wherein and at least one of the electrodes is formed of a transparent electrode in order to take out the emitted light.

For example, an organic electroluminescence element is, most simply, formed in a structure of anode/light emission layer/cathode. However, the organic layer is usually formed in a laminated structure of various separately functioned layers of, for example, a hole transport layer, a light emission layer and a electron transport layer in order to improve light emission efficiency.

The thickness of each thin film of the organic layers is in the range of 1 nm-several μm. In addition to the abovementioned layers, when needed, various layers such as an electron blocking layer, a hole blocking layer or a buffer layer are appropriately laminated in a prescribed order in order to enable smooth migration of electrons and holes.

In these organic layers constituting an organic EL element, examples of an organic light emitting material include: aromatic heterocyclic compounds such as carbazole, carboline and diazacarbazole; triarylamine derivative; stilbene derivative; polyarylene an aromatic condensation multiring compound; a heteroaromatic condensation compound; a metal complex compound; and a mono-oligomer or a multi-oligomer thereof. However, in the present invention, the organic light emitting material is not limited thereto, and well-known materials may be widely used.

Further in a light emitting layer (film forming materials, about 0.1-20% by mass of dopant may preferably be contained in a luminescent material. As a dopant the following materials are contained in an amount of 0.1-20% by mass, namely, for example: a well-known fluorescent dye such as a perylene derivative and a pyrene derivative; and in the case of a phosphorescent luminescence type light emission layer, complex compounds such as an ortho-metalated iridium complex, for example, tris(2-phenylpyridine)iridium, bis(2-phenylpyridine)(acetylacetonato)iridium and bis(2,4-difluorophenylpyridine) (picolinate)iridium. The coating thickness of a light emission layer is in the range of 1 nm-several hundreds nm.

Examples of a material employed in a hole injection-transport layer include: polymer materials such as a conductive polymer, for example, a phthalocyanine derivative, heterocycle azole, aromatic tertiary amine, polyvinyl carbazole, and polyethylene dioxithiophene/polystyrene sulfonate (PEDOT: PSS); compounds used in a light emission layer, for example, carbazole light emitting compounds such as 4,4'-dicarbazolyl-biphenyl and 1,3-dicarbazolyl-benzene, low molecular weight light emitting materials such as pyrene light emitting materials, for example, (di)azacarbazole and 1,3,5-tripyrenylbenzene, and polymer light emitting materials such as polyphenylene vinylene and polyfluorene.

As electron injection-transport materials, metal complex compounds such as 8-hydroxyquinolinate lithium or bis(8-hydroxyquinolinate) zinc, and the following nitrogen containing-five membered cyclic compounds, namely, derivatives of oxazole, thiazole, oxadiazole, thiadiazole or triazole, are preferably cited. Specific examples include: 2,5-bis(1-phenyl)-1,3,4-oxazole, 2,5-bis(1-phenyl)-1,3,4-thiazole, 2,5-bis(1-phenyl)-1,3,4-oxadiazole, 2-(4"-tert-butylphenyl)-5-(4"-biphenyl) 1,3,4-oxadiazole, 2,5-bis(1-naphthyl)-1,3,4-oxadiazole, 1,4-bis[2-(5-phenyloxadiazolyl)]benzene, 1,4-bis[2-(5-phenyloxadiazolyl)-4-tert-butylbenzene], 2-(4'-tert-butylphenyl)-5-(4"-biphenyl)-1,3,4-thiadiazole, 2,5-bis(1-naphthyl)-1,3,4-thiadiazole, 1,4-bis[2-(5-phenylthiadiazolyl)]benzene, 2-(4'-tert-butylphenyl)-5-(4"-biphenyl)-1,3,4-triazole, 2,5-bis(1-naphthyl)-1,3,4-triazole, and 1,4-bis[2-(5-phenylthoriazolyl)]benzene.

These organic materials preferably have a cross-linking group such as a vinyl group A material having a cross-linking group can be easily coated since it cross-links by heat or light. Further, when the coated layer is further coated or laminated, such a material is preferable since it cross-links to form a network polymer, whereby the layer becomes insoluble.

Namely, a precursor layer is formed as a precursor of an organic material layer by coating, and by the microwave heating of the electrode material having electromagnetic wave absorbing function, cross-linkage is proceeded, whereby each functional layer can be obtained.

The thickness of each organic layer of the organic EL element is necessarily 0.05-0.3 μm and preferably 0.1-0.2 μm.

The method of forming the organic layer (each functional layer of an organic EL element) is not specifically limited and any of a vacuum evaporation method or a coating method is usable. Of these, preferable are, for example, a coating method and a printing method. Examples of an applicable coating method include: a spin coating method, a transfer coating method and an extrusion coating method. In view of a material utilization ratio, a method which enables patterning such as a transfer coating method or an extrusion method is preferable, and specifically preferable is a transfer coating method.

Examples of a printing method include: screen printing, offset and inkjet printing. When, as a display device, a thin film, small size of an element and superimpose of ROB are considered, a highly accurate and highly minute printing such as offset printing or inkjet printing is preferably used.

There are melting characteristics (a solubility parameter, an ionization potential and polarity) in each organic material at each, and the solvent which can dissolve the organic material is limited. Also, since the solubility is also different according to the material, the concentration cannot be generally decided, however, the type of solvent can be selected from the known solvents according to the organic EL material, which meets the above-mentioned conditions. Examples of a solvent include: halogen-containing hydrocarbon solvents such as dichloromethane, dichloroethane, chloroform, carbon tetrachloride, tetrachloroethane, trichloroethane, chlorobenzene, dichlorobenzene and chlorotoluene; ether solvents such as dibutylether, tetrahydrofuran, dioxane, and anisole; alcohol solvents such as methanol, ethanol, isopropanol, butanol, cyclohexanol, 2-methoxyethanol, ethylene glycol and glycerin; aromatic hydrocarbon solvents such as benzene, toluene, xylene and ethylbenzene; paraffin solvents such as hexane, octane, decane, and tetralin; ester solvents such as ethylacetate, butylacetate and amylacetate; amide solvents such as N,N-dimethylformamide, N,N-dimethylacetamide and N-methylpyrolidone; ketone solvents such as acetone, methylethyl ketone, cyclohexanone and isophorone; amine solvents such as pyridine, quinoline and aniline; nitrile solvents such as acetonitrile and valeronitrile; and sulfur-containing solvents such as thiophene and carbon disulfide.

The applicable solvent is not limited thereto, and, also, two or more of these solvents may be mixed to use as a solvent.

Although it depends on each functional layer material, among these solvents, the following solvents are preferably used for organic EL materials: Namely, as a good solvent, an aromatic solvent, a halogen-containing solvent and an ether solvent may be cited. Of these, preferable are an aromatic solvent and an ether solvent. As a poor solvent, an alcohol solvent, a ketone solvent and a paraffin solvent may be cited. Of these, preferable are an alcohol solvent and a paraffin solvent.

Of the two electrodes, as a conductive material used for the anode which has a function to inject positive holes, materials having a work function of more than 4 eV are suitably used. Examples of such a material include: such as silver, gold, platinum, palladium and alloys thereof; metal oxides such as tin oxide, indium oxide and ITO; and organic conductive polymers such as polythiophene and polypyrrole. A light permeating material is preferably used. As a transparent electrode, ITO is preferably used. Examples of a method of forming an ITO transparent electrode include vacuum evaporation using a mask and photolithography patterning, however, the method is not limited thereto.

As a conductive material used for the cathode, materials having a work function of smaller than 4 eV are suitably used. Examples of such a material include: such as magnesium and aluminum; alloys such as magnesium/silver and lithium aluminum as typical examples. Examples of a method of forming a cathode include vacuum evaporation using a mask, photolithography patterning, plating and printing, however, the method is not limited thereto.

According to the present invention, in an electronic device, for example, an organic EL element having the above structure, each functional layer precursor can be transformed into a functional layer by using an electrode or an electrode precursor material having an electromagnetic wave absorbing function and irradiation with an electromagnetic wave.

EXAMPLES

The present invention will be specifically explained using the following examples, however, the present invention is not limited thereto.

Example 1

Example of Thin Film Transistor Having Bottom Gate-Top Contact Structure

In FIGS. 1(1)-1(4), schematic cross-sectional views illustrating the manufacturing process are shown.

As substrate 6, a glass substrate was used, and an ITO film was formed on the substrate by sputtering. Then, the ITO film was subjected to patterning to form gate electrode 4 (100 nm in thickness).

Subsequently, gate insulation layer 5 constitute of 200 nm thick silicon oxide was formed by an atmospheric pressure plasma CVD method (FIG. 1(1)). The atmospheric pressure plasma treatment apparatus disclosed in FIG. 6 of JP-A No. 2003-303520 was used.

(Gases Used)
Inert gas: helium 98.25% by volume
Reactive gas: oxygen gas 1.5% by volume
Reactive gas: tetraethoxysilane vapor (bubbled with helium gas) 0.25% by volume (Discharge Conditions)
High frequency power source: 13.56 MHz
Discharge power: 10 W/cm$^2$ (Electrode Conditions)

The electrode is a grounded roll electrode having a dielectric material (specific dielectric constant; 10) with a smoothed surface at a 5 μm Rmax, wherein a stainless steel jacket roll base material having a cooling device employing chilled water is coated with a 1 mm thickness of alumina via ceramic spraying, followed by being coated with a solution prepared by diluting tetramethoxysilane with ethyl acetate and dried, and then by being sealed via ultraviolet irradiation. In contrast, to prepare an application electrode, a hollow square-shape stainless steel pipe was coated with the above dielectric material under the same condition as above.

Subsequently, 0.8 g of the following bicyclo porphyrin compound was dissolved in 1.25 g of chloroform to form a solution which was then used as an ink for inkjet printing to eject the solution onto a channel formation area on the gate insulator film, followed by drying to form semiconductor precursor material area (thin film) 1' (thickness of 30 nm) FIG. 1(2).

Then, the substrate was irradiated with a microwave (2.45 GHz) with an output power of 500 W under an atmospheric pressure in an atmosphere in which the partial pressure ratio of oxygen to nitrogen was 1:1. The microwave irradiation was continued for 15 minutes while keeping 200° C. by controlling the output power of the electromagnetic wave.

By irradiating the substrate with a microwave, the gate electrode area constitute of ITO was heated first to an elevated temperature, and semiconductor precursor area 1' (bicyclo porphyrin compound) formed on the channel forming area an the gate electrode was also heated to almost the same temperature, whereby a film of copper complex of TBP:tetrabenzporphyrin was obtained via thermal decomposition. Thus, semiconductor layer 1 (thickness of 50 nm) was formed. FIG. 1(3)

Next, gold was vacuum evaporated through a mask to form source electrode 2 and drain electrode 3, and, thus, a thin film transistor was manufactured. Each dimension was as follows: 10 μm in the width, 50 μm in the length (channel width), 50 nm in the thickness, and the distance between the source electrode and the drain electrode (channel length) was 15 μm.

The thin film transistor produced by the above method showed p-type enhancement mode. An increase in the drain current was observed (transfer characteristics), when the gate bias was swept from +10 V to −40 V while setting the drain bias to −10 V. A thin film transistor exhibiting a mobility estimated from the saturation region of 1.0 cm$^2$/Vs, an on/off ratio of 6 digits, p-type enhancement mode and an excellent performance was obtained.

Example 2

Manufacturing of Thin Film Transistor 201

A transistor was Manufactured in the same manner as in Example 1.
(Formation of Semiconductor Precursor Thin Film)

Indium nitrate, zinc nitrate and gallium nitrate were mixed in a molar ratio of 1:0.1:0.5 and dissolved in water (a mixture of water/ethanol=9/1 in mass ratio) to form a 10 mass % aqueous solution, which was then used as an ink for inkjet printing to eject the solution onto a channel formation area, followed by drying by heating at 150° C. for 10 minutes to form semiconductor precursor material thin film 1' was formed (FIG. 1(2)).

By conducting microwave irradiation under the same condition as in Example 1, semiconductor precursor material thin film 1' was transformed into semiconductor layer 1 in the same way as above due to the thermal oxidation with the heat transferred from the electrode.

Subsequently, the source electrode and the drain electrode were formed in the same manner as in Example 1 to obtain thin film transistor element 201.

Thin film transistor 201 exhibited an excellent performance, a mobility of 3 cm$^2$/Vs and an on/off ratio of 5 digits.
(Manufacturing of Thin Film Transistor 202)

Thin film transistor 202 was manufactured in the same manner as above except that, semiconductor layer 1 was formed, after a semiconductor precursor thin film was formed, by irradiating the substrate with a microwave of 28 GHz using a gyrotron oscillating tube to heat the substrate at 200° C.

Transistor 202 exhibited also an excellent performance, a mobility of 10 cm$^2$/Vs and an on/off ratio of 6 digits.
(Manufacturing of Thin Film Transistor 203)

Thin film transistor 203 was manufactured in the same manner as the manufacturing of thin film transistor 201 except that the heating temperature by the irradiation with the microwave was 95° C.

When the evaluation of transistor 203 was carried out in the same manner as described above, transistor 203 exhibited a mobility of 0.05 cm$^2$/Vs and an on/off ratio of 3 digits. The performance of the transistor was observed, but it was not satisfactory.
(Manufacturing of Thin Film Transistor 204)

Thin film transistor 204 was manufactured in the same manner as the manufacturing of thin film transistor 201 except that the heating temperature by the irradiation with the microwave was 130° C.

Transistor 204 exhibited a satisfactory performance, a mobility of 0.2 cm$^2$/Vs and an on/off ratio of 4 digits.
(Manufacturing of Thin Film Transistor 205)

Thin film transistor 205 was manufactured in the same manner as the manufacturing of thin film transistor 201 except that the heating temperature by the irradiation with the microwave was 280° C.

Transistor 205 exhibited a satisfactory performance, a mobility of 7 cm$^2$/Vs and an on/off ratio of 5 digits.
(Manufacturing of Thin Film Transistor 206)

Thin film transistor 206 was manufactured in the same manner as the manufacturing of thin film transistor 201 except that the heating temperature by the irradiation with the microwave was 350° C.

Transistor 206 exhibited a satisfactory performance, a mobility of 10 cm$^2$/Vs and an on/off ratio of 3.5 digits. Although the mobility was high, the on/off ratio was relatively low.

(Manufacturing of Thin Film Transistor 207)

Thin film transistor 207 was manufactured in the same manner as the manufacturing of thin film transistor 201 except that the heating was carried out in an electric furnace instead of a microwave.

Performance of transistor 207 was observed. Transistor 207 exhibited a mobility of 0.01 cm$^2$/Vs and an on/off ratio of 3 digits.
(Manufacturing of Thin Film Transistor 208)

Thin film transistor 208 was manufactured in the same manner as the manufacturing of thin film transistor 201 except that a 300 μm thick polyimide resin was used as a substrate instead of the glass substrate.

Transistor 208 exhibited an excellent performance like that of thin film transistor 201.
(Manufacturing of Thin Film Transistor 209)

Thin film transistor 209 was manufactured in the same manner as the manufacturing of thin film transistor 208 except that the heating was carried out in an electric furnace instead of a microwave.

Transistor 209 exhibited a mobility of 0.001 cm$^2$/Vs and an on/off ratio of 3 digits.
(Manufacturing of Thin Film Transistor 210)

Thin film transistor 210 was manufactured in the same manner as the manufacturing of thin film transistor 201 except that a 300 μm thick PES (polyether sulfone) was used as a substrate instead of the glass substrate.

Transistor 210 exhibited an excellent performance like that of thin film transistor 201.
(Manufacturing of Thin Film Transistor 211)

Thin film transistor 211 was manufactured in the same manner as the manufacturing of thin film transistor 210 except that the heating was carried out in an electric furnace instead of a microwave.

Transistor 211 exhibited no performance as a thin film transistor.

Example 3

In FIGS. 2(1)-2(5), schematic cross-sectional views illustrating the manufacturing process are shown.

As substrate 6, a glass substrate was used, and an ITO film was formed on the substrate by sputtering. Then, the ITO film was subjected to patterning to form gate electrode 4 (100 nm in thickness).

Next, Aqua Micah NN110 (perhydropolysilazane/xylene solution: produced by AZ Electronic Materials) was applied on the substrate by a spin coat method (3000 rpm×30 sec), followed by drying to obtain insulating film precursor layer 5' (200 nm in thickness). FIG. 2(1)

Microwave irradiation was carried out in the same manner as in Example 1, namely, Next, Aqua Micah NN110 (perhydropolysilazane/xylene solution: produced by AZ Electronic Materials) was applied on the substrate by a spin coat method (3000 rpm×30 sec), followed by drying to obtain insulating film precursor layer 5' was formed (200 nm in thickness). FIG. 2(1)

Microwave irradiation was carried out in the same manner as in Example 1, namely, the substrate was irradiated with a microwave (2.45 GHz) with an output power of 500 W under an atmospheric pressure in an atmosphere in which the partial pressure ratio of oxygen to nitrogen was 1:1. Three cycles of microwave irradiation was carried out, where the duration of one cycle was 90 sec.

With the heat generated by the ITO which was a gate electrode, adjoining insulating film precursor material layer 5' was subjected to a heat treatment (calcination) to form a silica glass film, whereby an insulating layer was formed. FIG. 2(2)

(Formation of Semiconductor Precursor Thin Film)

Indium nitrate, zinc nitrate and gallium nitrate were mixed in a molar ratio of 1:1:1 and dissolved in wetter to form a 10 mass % aqueous solution, which was then used as an ink for inkjet printing to eject the solution onto a channel formation area, followed by drying by heating at 150° C. for 10 minutes to form semiconductor precursor material area (thin film) 1' (FIG. 2(3)).

By conducting microwave irradiation under the same condition as in Example 2, semiconductor precursor material area (thin film) 1' was transformed into semiconductor layer 1 in the same way as above due to the thermal oxidation with the heat transferred from the electrode.

Subsequently, a source electrode and a drain electrode were formed in the same manner as in Example 1 to obtain a thin film transistor element.

The thin film transistor exhibited an excellent performance like in Example 1, a mobility of 5 cm$^2$/Vs or more and an on/off ratio of 5 digits.

Example 4

A thin film transistor element was manufactured in the same manner as in Example 3 except that the insulating layer was replaced with the following polymer insulating layer.

(Insulating Layer Precursor Material Layer)

A gate electrode was formed in the same manner as in Example 3 on a substrate. On the substrate, heat curable polyimide (CT4112, produced by KYOCERA Chemical Corp.) was spin coated at 4500 rpm×20 sec (300 nm) to obtain insulating film precursor material layer 5' having a thickness of 200 nm.

By conducting microwave irradiation under the same condition as in Example 3, insulating film precursor material layer 5' was transformed into insulating film 5 by being hardened with the heat transferred from the electrode. FIG. 2(2)

Subsequently, semiconductor layer 1, source electrode 2 and drain electrode 3 were formed in the same manner as in Example 3 to obtain a thin film transistor element.

The manufactured thin film transistor exhibited an excellent performance like in Example 1, a mobility of 10 cm$^2$/Vs or more and an on/off ratio of 5 digits.

Example 5

A thin film transistor element was manufactured in the same manner as in Example 2. FIG. 6(1)

On semiconductor layer 1 constitute of formed metal oxide, an aqueous solution of uncured PVP having the following composition was applied on by an inkjet method to form semiconductor protective layer precursor film 7'. FIG. 6(2).

(Uncured PVP Solution)
Poly(4-vinylphenol) produced by Aldrich 10 masse
Crosslinking agent * 5 mass %
2-acetoxy-1-methoxypropane 85 mass %
* Crosslinking agent: Poly(melamine-co-formaldehyde) methylated, 84-mass % solution in 1-butanol (produced by ALDRICH)

Then, the substrate was irradiated with a microwave (2.45 GHz) with an output power of 500 W under an atmospheric pressure in an atmosphere in which the partial pressure ratio of oxygen to nitrogen was 1:1. The microwave irradiation was continued for 120 minutes while keeping 200° C. by controlling the output power of the electromagnetic wave.

When irradiated with the microwave, semiconductor protective layer precursor film 7' was cured to form insulating layer 7 constitute of PVP on the device. FIG. 6(3)

It was shown that the method of the present invention is applicable to form an protective film over a thin film transistor element.

Example 6

Example of Manufacturing of Bottom Gate-Top Contact Thin Film Transistor

In FIGS. 7(1)-7(4), schematic cross-sectional views illustrating the manufacturing process are shown.

In the same manner as in Example 3, a glass substrate was used as substrate 6, and an ITO film was formed on the substrate by sputtering. Then, the ITO film was subjected to patterning to form gate electrode 4. Further, in the same manner as in Example 3, insulating layer precursor material layer 5' was formed using Aqua Micah NN110 (200 nm in thickness). (FIG. 7(1))

After drying, subsequently, Indium nitrate, zinc nitrate and gallium nitrate were mixed in a molar ratio of 1:1:1 and dissolved in water (a mixture of water/ethanol=9/1 in mass ratio) to form a 10 mass % aqueous solution, which was then used as an ink for inkjet printing to eject the solution onto a channel formation area, followed by drying by heating at 150° C. for 10 minutes to form semiconductor precursor material thin film 1' (FIG. 7(2)).

The substrate on which insulating layer precursor material layer 5' and semiconductor precursor material thin film 1' were formed was irradiated with a microwave. Namely, the substrate was irradiated with a microwave (2.45 GHz) with an output power of 500 W under an atmospheric pressure in an atmosphere in which the partial pressure ratio of oxygen to nitrogen was 1:1. Four cycles of microwave irradiation was carried out, where the duration of one cycle was 90 sec. By the microwave irradiation, insulating film precursor material layer 5' and semiconductor precursor material thin film 1' were transformed into insulating layer 3 constitute of silicon oxide and semiconductor layer 1, respectively (FIG. (3)).

Subsequently, in the same manner as in Example 1, a drain electrode was formed via vacuum evaporation of gold to manufacture a thin film transistor element (FIG. 7(4)).

Each dimension the source electrode and the drain electrode was as follows: 10 μm in the width, 50 μm in the length (channel width), 50 nm in the thickness, and the channel length was 15 μm.

Thus manufactured thin film transistor element exhibited a mobility of 5 cm$^2$/Vs and an on/off ratio of 5 digits. The performance of the thin film transistor element was excellent, whereby the conversions to the insulating layer and to the semiconductor layer were confirmed.

Example 7

Similarly, a bottom gate-top contact thin film transistor element was manufactured.

In FIGS. 8(1)-8(4), schematic cross-sectional views illustrating the manufacturing process are shown.

As substrate 6, a glass substrate was used, and an ink containing nanoparticles of gold (prepared according to the method disclosed in JP-A No. 11-80647) was ejected via an inkjet method to form a pattern of the gate electrode on the substrate while the temperature was kept at 100° C. Thus, electrode precursor thin film 4' (100 nm in thickness) was obtained. FIG. 8(1)

Subsequently, on (gate) electrode precursor thin film 4', an ITO nanoparticle ink (NanoTek Slurry ITO (toluene), produced by C. I. KASEI Co. Ltd.) was similarly ejected via an inkjet method to form a pattern of electromagnetic wave absorbing layer 4" constitute of ITO particles (50 nm in thickness). FIG. 8(2)

Subsequently, in the same manner as in Example 6, insulating film precursor material layer 5' was formed using Aqua Micah NN110 (200 nm in the thickness), and, after drying, a mixture of In, Zn and Ga salts was ejected via an inkjet method to form a pattern of semiconductor precursor material thin film 1', followed by ejecting the abovementioned ITO nanoparticle ink via an inkjet method to form patterns of a source electrode and a drain electrode. Thus, electrode precursor thin film 4' was formed (FIG. 8(3)).

Subsequently, the substrate on which electrode precursor thin film 4', electromagnetic wave absorbing layer 4", insulating film precursor material layer 5' and semiconductor precursor material thin film 1' were formed was irradiated with a microwave. Namely, the substrate was irradiated with a microwave (2.45 GHz) with an output power of 500 W under an atmospheric pressure in an atmosphere in which the partial pressure ratio of oxygen to nitrogen was 1:1 to heat the substrate at 200° C. Four cycles of microwave irradiation was carried out, where the duration of one cycle was 90 sec.

By the microwave irradiation, above mentioned electromagnetic wave absorbing layer 4" (gate electrode) and electrode precursor thin film 4' (source electrode and drain electrode) generated heat by absorbing the microwave, whereby electrode precursor thin film 4', insulating film precursor material layer 5', semiconductor precursor material thin film 1' and electrode precursor thin film 4' were simultaneously transformed into a gate electrode, gate insulating layer 5, semiconductor layer 1 source electrode 2 and drain electrode 3, respectively to manufacture a thin film transistor element (FIG. 8(4)).

Thus manufactured thin film transistor element exhibited a mobility of 5 $cm^2$/Vs and an on/off ratio of 5 digits. The performance of the thin film transistor element was excellent, whereby the conversions to the electrode, to the insulating layer and to the semiconductor layer were confirmed.

Example 8

A top gate-bottom contact thin film transistor element was manufactured.

In FIGS. 9(1)-9(5), schematic cross-sectional views illustrating the manufacturing process are shown.

As substrate 6, on a glass substrate, source electrode 2 and drain electrode 3 were formed via vacuum evaporation of gold, followed by pattering (50 nm in the thickness). FIG. 9(1).

Subsequently, Indium nitrate, zinc nitrate and gallium nitrate were mixed in a molar ratio of 1:1:1 and dissolved in water (a mixture of water/ethanol=9/1 in mass ratio) to form a 10 mass % aqueous solution, which was then used as an ink for inkjet printing to eject the solution onto a channel formation area between the source electrode and the drain electrode, followed by drying by heating at 150° C. for 10 minutes to form semiconductor precursor material thin film 1' (50 nm in the thickness) (FIG. 9(2)).

Next, insulating film precursor material layer 5' was formed using Aqua Micah NN110 via an inkjet method (200 nm in the thickness). FIG. 9(3)

Subsequently, an ITO nanoparticle ink (NanoTek Slurry ITO (toluene), produced by C. I. KASEI Co., Ltd.) was ejected via an inkjet method to form a pattern of gate electrode to form electrode precursor thin film 4' (100 nm in thickness). FIG. 9(4).

In the same manner as in Example 7, irradiation with a microwave was carried out, whereby semiconductor precursor material thin film 1', insulating film precursor material layer 5' and electrode precursor thin film 4' (gate electrode) were simultaneously transformed into a semiconductor layer, a gate insulating layer and a gate electrode, respectively to manufacture a thin film transistor element. FIG. 9(5)

Thus manufactured thin film transistor element exhibited a mobility of 5 $cm^2$/Vs and an on/off ratio of 5 digits. The performance of the thin film transistor element was excellent, whereby the conversions to the electrode, to the insulating layer and to the semiconductor layer were confirmed.

Example 9

Similarly, a top gate-bottom contact thin film transistor was manufactured.

In FIGS. 10(1)-10(4), schematic cross-sectional views illustrating the manufacturing process are shown.

(Thin Film Transistor Element 901)

Corona discharge treatment was first performed under a condition of 50 W/$m^2$/min on a polyethylenenaphthalate film (200 μm in the thickness) as a substrate 6. Heat insulating layer 8 was then formed as follows for improving the adhesive.

(Formation of Heat Insulating Layer)

A 300 nm thick silicon oxide film was continuously formed with an atmospheric pressure plasma CVD method under the following condition to form heat insulating layer 8 (FIG. 10(1)). The atmospheric pressure plasma treatment apparatus disclosed in FIG. 6 of JP-A No. 2003-303520 was used.

(Gases Used)

Inert gas: helium 98.25% by volume
Reactive gas: oxygen gas 1.5% by volume
Reactive gas: tetraethoxysilane vapor (bubbled with helium gas) 0.25% by volume (Discharge Conditions)

High frequency power source: 13.56 MHz
Discharge power: 10 W/$cm^2$ (Electrode Conditions)

The electrode is a grounded roll electrode having a dielectric material (specific dielectric constant: 10) with a smoothed surface at a 5 μm Rmax, wherein a stainless steel jacket roll base material having a cooling device employing chilled water is coated with a 1 mm thickness of alumina via ceramic spraying, followed by being coated with a solution prepared by diluting tetramethoxysilane with ethyl acetate and dried, and then by being sealed via ultraviolet irradiation. In contrast, to prepare an application electrode, a hollow square-shape stainless steel pipe was coated with the above dielectric material under the same condition as above.

Subsequently, on the insulating layer, source and drain electrodes (vacuum evaporation of gold), semiconductor precursor material thin film 1', insulating film precursor material layer 5' and electrode precursor thin film 4' which was patterned to form a gate electrode using an ITO particle ink were subsequently formed (FIG. 10(2)).

The substrate was irradiated with a microwave in the same manner as in Example 7, whereby semiconductor precursor material thin film 1', insulating film precursor material layer 5', electrode precursor thin film 4' were simultaneously transformed into semiconductor layer 1, gate insulating layer 5 and gate electrode 4, respectively to manufacture thin film transistor 901 (FIG. 10(3)).

FIG. 10(4) shows a cross-sectioned view of the element and the thickness of each layer. Since the thickness of the heat insulating layer of this element is 300 nm, the shortest distance (I) between the heat source and the substrate is 450 nm, and the longest distance (D) between the heat source and the precursor is 15 μm (almost the same as the channel length (c=15 μm)). Accordingly, the shortest distance between the heat source and the resin substrate/the longest distance between the heat source and the precursor=1/33.3.

(Thin Film Transistor Element 902)

Thin film transistor 902 was manufactured in the same manner as thin film transistor 901 except that the thickness of insulating film precursor material layer 5' was 10 nm and the thickness of the insulating layer was 10 nm. In this constitution: the shortest distance between the heat source and the resin substrate/the longest distance between the heat source and the precursor=1/214.3.

The deformation of the substrate of this thin film transistor element was larger when visually observed.

(Thin Film Transistor Element 903)

Thin film transistor 903 was manufactured in the same manner as thin film transistor 901 except that the thickness of insulating film precursor material layer 5' was 25 nm and the thickness of the insulating layer was 25 nm. In this constitution: the shortest distance between the heat source and the resin substrate/the longest distance between the heat source and the precursor=1/150.

(Thin Film Transistor Element 904)

Thin film transistor 904 was manufactured in the same manner as thin film transistor 901 except that the distance between the source electrode and the drain electrode 3 μm, the thickness of insulating film precursor material layer 5' was 1 μm and the thickness of the insulating layer was 1.5 μm.

In this constitution: the shortest distance between the heat source and the resin substrate/the longest distance between the heat source and the precursor=0.85.

(Thin Film Transistor Element 905)

Thin film transistor 905 was manufactured in the same manner as thin film transistor 901 except that the distance between the source electrode and the drain electrode 3 μm, the thickness of insulating film precursor material layer 5' was 2 μm and the thickness of the insulating layer was 2 μm.

In this constitution: the shortest distance between the heat source and the resin substrate/the longest distance between the heat source and the precursor=1.35.

The curl of the substrate showed a tendency to become larger when visually observed.

The thin film transistor elements having a value of the shortest distance between the heat source and the resin substrate/the longest distance between the heat source and the precursor in the range of 1/200-1.0 exhibited a mobility of 5 cm$^2$/Vs and an on/off ratio of 5 digits. The performance of the thin film transistor element was excellent, whereby the conversions to the electrode, to the insulating layer and to the semiconductor layer were confirmed Example 10

Here, the example of application to an organic electroluminescence element is shown.

Insulating layer B constitute of silicon oxide was formed on a polyethyleneterephthalate film being substrate 6 via an atmospheric pressure plasma method in the same manner as in Example 6. FIG. 11(1)

Subsequently, an ITO thin film was formed via sputtering to form anode 11 (50 nm in the thickness). FIG. 11(2)

Further, hole injection layer 12 and hole transport layer 13 having the following compositions were coated. FIG. 11(3)

Hole Injection Layer

Poly (3,4-ethylenedioxythiophene)-polystyrene sulfonate (PEDOT/PSS, P Al 4083 produced by Bayer) was diluted with pure water to 70% and spin coated at 3000 rpm, for 30 seconds to form a film, followed by drying at 200° C. for 1 hour, whereby a hole injection layer having a thickness of 20 nm was formed.

Hole Transporting Layer

In a nitrogen atmosphere, a solution of 50 mg of hole transport material 1 dissolved in 10 ml of toluene was spin coated at 1500 rpm for 30 seconds on the hole transport layer to obtain a hole transport layer having a thickness of 20 nm.

Hole Transport Material 1

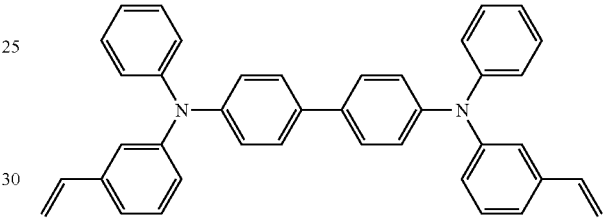

Subsequently, in a nitrogen atmosphere, the substrate was irradiated with a microwave (2.45 GHz) at an output power of 500 W under an atmospheric pressure. Three cycles of irradiation was carried out where the duration of one cycle was 90 seconds. In the hole transport layer, hole transport material 1 having a cross-linking group was heated to 100° C.-150° C. to be cross-linked (heat curing) and changed to an insoluble form due to the formation of a network polymer (when a light emission layer and an electron transport layer were coated later, no dissolution of the hole transport layer was observed) (FIG. 11(4)).

Subsequently, on hole transport layer 13, a solution of 100 mg of following compound 1-1 and 10 mg of following Ir-15 dissolved in 10 ml of toluene was spin coated at 1000 rpm for 30 seconds, followed by drying at 120° C. under vacuum for one hour, to obtain a light emission layer having a thickness of 50 nm.

Next, on this light emission layer, a solution of 50 mg of electron transport material 1 dissolved in 10 mg of 1-butanol was spin coated at 5000 rpm for 30 seconds, followed by drying at 60° C. for 1 hour, to obtain an electron transport layer having a thickness of 15 nm.

1-1

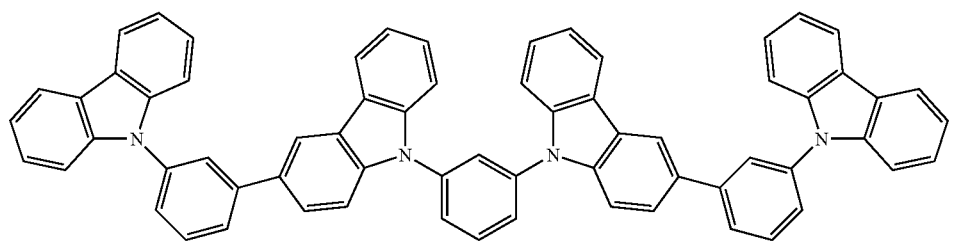

Ir-15

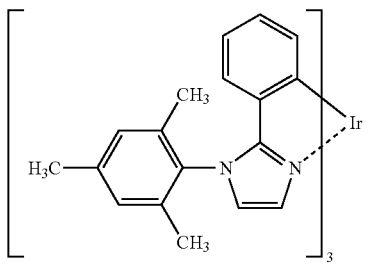

Electron Transport Material 1

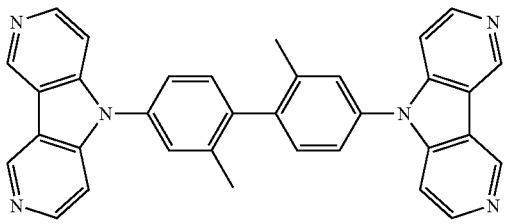

Then, this substrate was fixed to the substrate holder of a vacuum evaporator, the vacuum chamber was evacuated down to $4 \times 10^{-4}$ Pa, and 1.0 nm of lithium fluoride as a cathode buffer layer and 110 nm of aluminum as a cathode were vacuum evaporated. Thus, an organic EL element was manufactured.

When an electric current was passed through this organic EL device, almost prescribed luminescence was obtained. No differences in the luminance and the life of the element were observed when compared with a sample separately manufactured by irradiating the substrate after a hole transport layer was formed with an ultraviolet ray for 180 seconds to carry out photopolymerization and cross linkage. It was found that, by the irradiation with the microwave, a sufficiently cross linked hole transport layer was obtained without turbulence of a layer at the interface.

What is claimed is:

1. A method of manufacturing an electronic device comprising the sequential steps of;
   providing a thermal conversion material or an area comprising the thermal conversion material and, in an adjoining area or in a vicinity of the thermal conversion material or the area comprising the thermal conversion material, a material having an electromagnetic wave absorbing function or an area comprising the material having the electromagnetic wave absorbing function, in at least a portion on a substrate; and
   irradiating the substrate with an electromagnetic wave to transform the thermal conversion material into a functional material using a heat generated by the material having the electromagnetic wave absorbing function.

2. The method of claim 1, wherein the electromagnetic wave is a microwave.

3. The method of claim 1, wherein the material having the electromagnetic wave absorbing function is a metal oxide.

4. The method of claim 3, wherein the metal oxide comprises a metal oxide of at least one selected from the group consisting of In, Sn and Zn.

5. The method of claim 1, wherein at least a portion of the thermal conversion material or the area comprising the thermal conversion material is formed by coating the thermal conversion material or a material comprising a thermal conversion material on the substrate.

6. The method of claim 5, wherein, as the thermal conversion material or the area comprising the thermal conversion material, at least one of an electrode precursor material, a semiconductor precursor material, an insulator precursor material and a protective film precursor material is formed by coating on the substrate.

7. The method of claim 6, wherein the electronic devise is a transistor element.

8. The method of claim 1, wherein the electronic devise is a transistor element.

9. The method of claim 8, wherein
   the transistor element has a bottom gate structure; and
   a gate electrode of the transistor element is the material having the electromagnetic wave absorbing function or the area comprising the material having the electromagnetic wave absorbing function.

10. The method of claim 1, wherein the thermal conversion material is a semiconductor precursor material.

11. The method of claim 10, wherein the thermal conversion material is an organic semiconductor precursor which is transformed into an organic semiconductor.

12. The method of claim 10, wherein the semiconductor precursor material is a metal oxide semiconductor precursor which is transformed into a metal oxide semiconductor.

13. The method of claim 12, wherein the metal oxide semiconductor precursor comprises at least one element selected from the group consisting of In, Zn and Sn.

14. The method of claim 12, wherein the metal oxide semiconductor precursor comprises Ga or Al.

15. The method of claim 1, wherein the thermal conversion material is an insulator film precursor material.

16. The method of claim 1, wherein the thermal conversion material is a protective film precursor material.

17. The method of claim 1, wherein the thermal conversion material is an electrode precursor material.

18. The method of claim 1, wherein
   the material having an electromagnetic wave absorbing function or the area comprising the material having the electromagnetic wave absorbing function comprises an electrode comprising the material having the electromagnetic wave absorbing function;
   the thermal conversion material or the area comprising the thermal conversion material comprises at least two areas selected from the group consisting of an insulator film precursor area, a semiconductor precursor area and a protective film precursor area; and
   after functional layer precursor areas comprising the at least two functional layer precursor areas selected from the group consisting of the insulator film precursor area, the semiconductor precursor area and the protective film precursor area are formed, the substrate is irradiated with the electromagnetic wave to heat the functional layer precursor areas.

19. The method of claim 1, wherein a temperature at which the thermal conversion material is heated by a heat generated by the material having the electromagnetic wave absorbing function is 100 to 300° C.

20. The method of claim 1, wherein the substrate is a resin substrate.

21. The electronic device manufactured by the method of claim 1.

22. The electronic device of claim 21 wherein the electronic device is a transistor element.

* * * * *